(12) United States Patent
Ohta et al.

(10) Patent No.: US 6,708,301 B1
(45) Date of Patent: Mar. 16, 2004

(54) FUNCTIONAL BLOCK FOR INTEGRATED CIRCUIT, SEMICONDUCTOR INTEGRATED CIRCUIT, INSPECTION METHOD FOR SEMICONDUCTOR INTEGRATED CIRCUIT, AND DESIGNING METHOD THEREFOR

(75) Inventors: Mitsuyasu Ohta, Katano (JP); Sadami Takeoka, Kadoma (JP); Toshihiro Hiraoka, Katano (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/381,377

(22) PCT Filed: Mar. 20, 1998

(86) PCT No.: PCT/JP98/01249

§ 371 (c)(1),
(2), (4) Date: Sep. 20, 1999

(87) PCT Pub. No.: WO98/43101

PCT Pub. Date: Oct. 1, 1998

(30) Foreign Application Priority Data

Mar. 21, 1997 (JP) ............................................. 9-067667

(51) Int. Cl.[7] ............................................. G01R 31/28
(52) U.S. Cl. ..................................................... 714/724
(58) Field of Search ................................. 714/724, 726, 714/733–735, 738

(56) References Cited

U.S. PATENT DOCUMENTS

| | | | | |
|---|---|---|---|---|
| 5,386,423 A | * | 1/1995 | Koo et al. ................... | 714/726 |
| 5,790,561 A | * | 8/1998 | Borden et al. ............... | 714/724 |
| 5,805,608 A | * | 9/1998 | Baeg et al. .................. | 714/726 |
| 5,809,039 A | * | 9/1998 | Takahashi et al. ........... | 714/718 |
| 5,812,562 A | * | 9/1998 | Baeg ........................... | 714/726 |
| 5,930,271 A | * | 7/1999 | Takahashi .................... | 714/738 |
| 6,055,661 A | * | 4/2000 | Luk ............................. | 714/736 |
| 6,108,806 A | * | 8/2000 | Abramovici et al. ........ | 714/725 |
| 6,119,257 A | * | 9/2000 | Negishi ....................... | 714/738 |

OTHER PUBLICATIONS

"Test Requirements for Embedded Core–Based Systems and IEEE P1500" Zorian, Y. International Test conference Proceedings Nov. 1, 1997–Nov. 6, 1997 pp. 191–199.*

"Design For Testabillity Techniques: A Comparative Analysis" by Miron Abramovici USPTO Lecture—Jun. 2002.*

* cited by examiner

Primary Examiner—Albert Decady
Assistant Examiner—Cynthia Britt
(74) Attorney, Agent, or Firm—McDermott, Will & Emery

(57) ABSTRACT

A semiconductor integrated circuit (1) includes first, second and second functional blocks (10, 20 and 30). The first, second and second functional blocks (10, 20 and 30) are coupled together via an inter-block signal line (2). The first functional block (10) includes: a logic circuit (11); a test data output circuit (12), which operates during testing and outputs a predetermined test data pattern; a testing standby circuit (14), which is connected between a selector (13) and an external bidirectional pin and makes the functional block enter a standby state during testing; a tristate buffer (15) that is made to have a high impedance by the testing standby circuit (14); and a decision result output circuit (16), which receives the test data pattern from the second functional block, compares the received test data pattern to an expected value stored therein, and outputs a decision result to a decision result signal line (5).

10 Claims, 22 Drawing Sheets

Fig. 5

| TEST DATA \ TIME | t 1 | t 2 |
|---|---|---|
| BIT 0 | 1 | 0 |
| BIT 1 | 1 | 0 |
| BIT 2 | 1 | 0 |
| BIT 3 | 1 | 0 |

Fig. 11

| TEST DATA \ TIME | t 1 | t 2 |
|---|---|---|
| BIT 0 | 1 | 0 |
| BIT 1 | 0 | 1 |
| BIT 2 | 1 | 0 |
| BIT 3 | 0 | 1 |

Fig. 15(a)

|  | t 1 | t 2 | t 3 | t 4 |
|---|---|---|---|---|
| BIT 0 | 0 | 1 | 0 | 1 |
| BIT 1 | 0 | 1 | 0 | 1 |
| BIT 2 | 0 | 1 | 0 | 1 |
| BIT 3 | 0 | 1 | 0 | 1 |
| BIT 4 | 1 | 0 | 1 | 0 |
| BIT 5 | 1 | 0 | 1 | 0 |
| BIT 6 | 1 | 0 | 1 | 0 |
| BIT 7 | 1 | 0 | 1 | 0 |

BITS 0–3 } GROUP

Fig. 15(b)

|  | t 5 | t 6 | t 7 | t 8 |
|---|---|---|---|---|
| BIT 0 | 0 | 1 | 0 | 1 |
| BIT 1 | 0 | 1 | 0 | 1 |
| BIT 2 | 1 | 0 | 1 | 0 |
| BIT 3 | 1 | 0 | 1 | 0 |
| BIT 4 | 0 | 1 | 0 | 1 |
| BIT 5 | 0 | 1 | 0 | 1 |
| BIT 6 | 1 | 0 | 1 | 0 |
| BIT 7 | 1 | 0 | 1 | 0 |

BITS 0–1 } GROUP

Fig. 15(c)

|  | t 9 | t 10 | t 11 | t 12 |
|---|---|---|---|---|
| BIT 0 | 0 | 1 | 0 | 1 |
| BIT 1 | 1 | 0 | 1 | 0 |
| BIT 2 | 0 | 1 | 0 | 1 |
| BIT 3 | 1 | 0 | 1 | 0 |
| BIT 4 | 0 | 1 | 0 | 1 |
| BIT 5 | 1 | 0 | 1 | 0 |
| BIT 6 | 0 | 1 | 0 | 1 |
| BIT 7 | 1 | 0 | 1 | 0 |

BIT 0 } GROUP

Fig. 16

| TIME / TEST DATA | t 1 | t 2 | t 3 |
|---|---|---|---|
| BIT 0 | 0 | 1 | 0 |
| BIT 1 | 0 | 1 | 0 |
| BIT 2 | 0 | 1 | 0 |
| BIT 3 | 0 | 1 | 0 |

Fig. 23

| TIME / TEST DATA | t 1 | t 2 |
|---|---|---|
| BIT 0 | 1 | 0 |
| BIT 1 | 1 | 0 |
| BIT 2 | 1 | 0 |
| BIT 3 | 1 | 0 |
| PATH CONTROL | 1 | 1 |

Fig. 24

| TIME / TEST DATA | t 1 | t 2 |
|---|---|---|
| BIT 0 | 1 | 0 |
| BIT 1 | 1 | 0 |
| BIT 2 | 1 | 0 |
| BIT 3 | 1 | 0 |
| PATH CONTROL | 0 | 0 |

US 6,708,301 B1

FUNCTIONAL BLOCK FOR INTEGRATED CIRCUIT, SEMICONDUCTOR INTEGRATED CIRCUIT, INSPECTION METHOD FOR SEMICONDUCTOR INTEGRATED CIRCUIT, AND DESIGNING METHOD THEREFOR

TECHNICAL FIELD

The present invention relates to a functional block for integrated circuit (hereinafter, simply referred to as an "IC functional block") implemented as a macro cell including a self-diagnosis circuit for detecting a fault between functional blocks, for example. The present invention also relates to a semiconductor integrated circuit that has been designed using the IC functional block and to respective methods for testing and designing the semiconductor integrated circuit.

BACKGROUND ART

In recent years, demand for designing a semiconductor integrated circuit more efficiently by implementing the circuit as a combination of functional blocks such as macro cells has been increasing. If a semiconductor integrated circuit is designed by combining a plurality of functional blocks with each other, however, there arises a problem in how to test a signal line interconnecting these functional blocks together. To solve this problem, according to a conventional technique, the operations of a pair of functional blocks interconnected are tested by externally supplying test data for operating these functional blocks. According to another conventional technique, scan circuits are provided for an output section of a functional block on the transmitting end and for an input section of an associated functional block on the receiving end, respectively. And the functional block on the transmitting end is tested through a scanning operation.

Hereinafter, a conventional method for testing a semiconductor integrated circuit made up of a plurality of functional blocks will be described with reference to the drawings.

FIG. 25 illustrates a simplified block configuration for a semiconductor integrated circuit to exemplify a method for testing the semiconductor integrated circuit as a first prior art example. As shown in FIG. 25, the semiconductor integrated circuit 500 includes first and second functional blocks 501 and 502, for example. A plurality of inter-block signal lines 503 are provided between the first and second functional blocks 501 and 502. External input terminals 504, through which parallel data can be input, are provided for the input end of the first functional block 501. External output terminals 505, through which parallel data can be output, are provided for the output end of the second functional block 502.

A test is carried out between these functional blocks in the following manner. First, a test data pattern is input through the external input terminals 504. The first functional block 501 supplies a result of an operation, which has been performed responsive to the test data pattern received, as an output signal onto the inter-block signal lines 503. Next, an output signal, which might have been affected by a fault during the propagation through the inter-block signal lines 503, is input to the second functional block 502. The second functional block 502 outputs a result of an operation, which has been performed responsive to the input signal, through the external output terminals 505. Based on this result of operation, it is determined whether or not there is any fault, thereby testing the semiconductor integrated circuit 500. A similar technique is also applicable to even a semiconductor integrated circuit including a multiplicity of functional blocks. That is to say, a test data pattern is input to each of these functional blocks, and it is decided whether the output result thereof is correct or erroneous.

FIG. 26 illustrates a simplified block configuration for a semiconductor integrated circuit to exemplify another method for testing the semiconductor integrated circuit as a second prior art example. As shown in FIG. 26, the semiconductor integrated circuit 510 includes first and second functional blocks 511 and 512, for example. A plurality of interblock signal lines 513 are provided between the first and second functional blocks 511 and 512. A scan-in pin 514, through which scan data is input, is provided for the input end of the first functional block 511. A scan-out pin 515, through which the scan data is output, is provided for the output end of the second functional block 512. At the output end of the first functional block 511, a shift register 516, which can output data in parallel to the outside, is provided. At the input end of the second functional block 512, a shift register 517, which can receive data in parallel from the outside, is provided. In this example, the scan-in pin 514, shift registers 516 and 517 and scan-out pin 515 are connected in series to each other.

A testing method is performed in the following manner. First, a test data pattern is scanned in through the scan-in pin 514 while being shifted by the shift register 516. The first functional block 511 supplies a result of an operation, which has been performed responsive to the test data pattern received, as an output signal onto the inter-block signal lines 513. Next, an output signal, which might have been affected by a fault during the propagation through the interblock signal lines 513, is input to the shift register 517 of the second functional block 512. The second functional block 512 shifts out the received signal through the scan-out pin 515. Based on the resultant data, it is determined whether or not there is any fault, thereby testing the semiconductor integrated circuit 510.

In the semiconductor integrated circuit and the testing method thereof according to the first prior art example, a plurality of pre-designed functional blocks (e.g., macro cells) are combined and reused to increase the efficiency in designing. However, if the first and second functional blocks 501 and 502 are combined and reused, it might be difficult for the user to produce test data patterns that should be propagated through the respective functional blocks. This is because the user is not acquainted with the internal configurations and operations of the functional blocks. Also, if the circuit sizes of the first and second functional blocks 501 and 502 are huge, then it is extremely complicated and very difficult to produce test data patterns that should be propagated through the respective functional blocks.

Also, the semiconductor integrated circuit and the testing method thereof according to the second prior art example require a shift operation to propagate the test data patterns through respective functional blocks. Thus, a large number of clock cycles should be consumed for that purpose, and it is difficult to supply the test data patterns rapidly and continuously enough to detect a fault promptly.

In view of the foregoing respects, a first object of the present invention is to make a test easily executable among functional blocks even if the user does not know much about the internal configurations and operations of the functional blocks combined or if the circuit sizes of the functional blocks are enormous. A second object of the present invention is to make the signal propagation delay fault between the functional blocks readily testable.

DISCLOSURE OF INVENTION

A first IC functional block according to the present invention achieves the first object and includes a test data output circuit for outputting test data responsive to a control signal indicating a test data transmission state.

According to the first IC functional block, a test data output circuit for outputting test data is provided within the IC functional block. Thus, if a semiconductor integrated circuit is constructed of the block and another IC functional block including a circuit that can receive the test data and compare it to an expected value, then the test data can be transmitted and received even when the user does not know much about the internal configuration and operation of the IC functional blocks. Accordingly, even if IC functional blocks are combined or the circuit sizes of the IC functional blocks are huge, a test among the IC functional blocks can be carried out easily and accurately in the semiconductor integrated circuit.

In the first IC functional block, the test data output circuit preferably includes a plurality of output signal lines enabling parallel output, and preferably outputs the test data such that an adjacent pair of the output signal lines have mutually different values. In such an embodiment, when a semiconductor integrated circuit including the first IC functional block is tested, a shortcircuit fault in a signal line, which interconnects IC functional blocks together, can be detected with a lot more certainty.

In the first IC functional block, the test data output circuit preferably outputs the test data changing from one value into the other. Then, the second object is accomplished. And in a semiconductor integrated circuit composed of a plurality of IC functional blocks, a fault between the IC functional blocks, e.g., a signal transition from 0 into 1 or from 1 into 0 in a time exceeding a predetermined delay time, can be detected.

In the first IC functional block, the test data output circuit preferably includes a plurality of output signal lines enabling parallel output, and preferably outputs the test data such that an adjacent pair of the output signal lines have mutually different values, and that each of the output signal lines outputs the test data alternately changing from one value into the other and vice versa. In such an embodiment, when a semiconductor integrated circuit including the first IC functional block is tested, test data with mutually different values, e.g., 0 and 1, can be output through an adjacent pair of output signal lines. In addition, the values of the output signal can also be changed alternately on the time axis, e.g., from 0 into 1 and then from 1 into 0. Accordingly, an adjacent pair of signal lines can be tested more accurately as to a crosstalk between an adjacent pair of output signal lines, for example.

In the first IC functional block, the test data output circuit preferably includes a plurality of output signal lines enabling parallel output, divides the output signal lines into a number $2^n$ of groups (where n is an integer equal to or larger than one) and outputs the test data such that the respective groups divided have mutually different values, which change from one value into the other. In such an embodiment, the second object is accomplished. And if a semiconductor integrated circuit including the first IC functional block is tested with the divisor n increased one by one every time until each group is no longer divisible, then a fault resulting from the interference by an adjacent signal line, e.g., delay or crosstalk, can be detected with more certainty from any combination of adjacent output signal lines. That is to say, there is no need to consider a combination of adjacent output signal lines in advance.

In the first IC functional block, the test data output circuit preferably includes: an original data generating section for generating and outputting first and second original data, the first original data being composed of zeros and ones alternately arranged, the second original data being obtained by inverting the first original data; and a selector circuit for receiving the first and second original data and selecting either the first or second original data in response to a selection signal externally supplied, thereby outputting the test data. In such an embodiment, when a semiconductor integrated circuit including the first IC functional block is tested, test data, in which a signal and an inverted signal thereof appear alternately and repeatedly, can be generated with more certainty. And if a plurality of selector circuits are provided such that the first and second original data are alternately selected by adjacent pairs of output signal lines, then test data, in which a signal and an inverted signal thereof appear alternately and repeatedly, can be generated in the adjacent pairs of output signal lines with more certainty.

In the first IC functional block, the test data output circuit preferably includes a plurality of selector circuits, and preferably further includes a shift register for receiving the selection signal and outputting the input selection signal to each said selector circuit. In such an embodiment, the number of selection signal lines can be cut down to one. Accordingly, the area of an interconnection line for the selection signal, which is provided outside, can be reduced and no burden is constituted on the interconnection region.

In the first IC functional block, the test data output circuit preferably includes: an original data generating section for generating and outputting original data composed of zeros and ones alternately arranged; and a plurality of inverter circuits, each receiving the original data. Control signals with mutually inverted values are preferably input to the inverter circuits, which output the test data with mutually inverted values. In such an embodiment, test data, where one signal and an inverted signal thereof are alternately arranged, can be generated without providing an interconnection for the inverted version of the original data. In addition, such test data, where one signal and an inverted signal thereof are alternately arranged, can also be generated for an adjacent pair of output signal lines. Accordingly, since it is not necessary to provide an interconnection for the inverted version of the original data, no burden is constituted on the circuit size.

In the first IC functional block, the test data output circuit preferably further includes a shift register for receiving the control signal and outputting the input control signal to each said inverter circuit.

In the first IC functional block, the test data output circuit preferably includes: a plurality of test data generating sections for generating mutually different test data; and a test data selecting section for selecting one of the test data generating sections responsive to the control signal. In such an embodiment, when a semiconductor integrated circuit including the first IC functional block is tested, optimum data for testing can be selectively output from a plurality of mutually different test data. As a result, the efficiency in testing can be improved.

The first IC functional block preferably further includes a decision result output circuit for receiving the test data responsive to a control signal indicating a test data reception state, deciding whether the test data received is correct or erroneous, and outputting a result of the decision. In such an embodiment, when a semiconductor integrated circuit including a plurality of first IC functional blocks is tested, it is possible to specify not only at least one of the IC functional blocks, which should receive the test data, but also the testing interval of each of the IC functional blocks. Accordingly, the accuracy of testing per IC functional block can be improved.

The first IC functional block preferably further includes a testing standby circuit for blocking the output of an output signal responsive to a control signal indicating a testing standby state. In such an embodiment, when a semiconductor integrated circuit including a plurality of first IC functional blocks is tested, one of the IC functional blocks can be in test data transmission state, while at the same time another IC functional block can be in testing standby state. Thus, even if a signal line is shared in common between blocks, it is possible to prevent the test data from colliding against each other on the signal line. As a result, testing can be performed between the blocks more accurately.

In the first IC functional block, the test data output circuit preferably includes an inverted data generating section for inverting a value of the test data responsive to the control signal indicating the testing standby state. In such an embodiment, in testing a semiconductor integrated circuit, where a plurality of first IC functional blocks are used and one of the IC functional blocks shares an output signal line in common with another IC functional block, the former IC functional block can be in test data transmission state, while at the same time the latter IC functional block can be in testing standby state. Accordingly, the inverted data generating section of the latter IC functional block outputs the inverted version of the test data, which has been output from the former IC functional block, to its output section, the output of which is being blocked (e.g., in high impedance state). Thus, if there is any fault in the output section of the latter IC functional block, the inverted version of the test data is output from the output section of the latter IC functional block to an output signal line, which is shared with the former IC functional block, so as to collide against the test data output from the former IC functional block. As a result, if there is any abnormality in the test data from the former IC functional block during the testing thereof, then that abnormality can be observed by the IC functional block on the receiving end with more certainty.

The first IC functional block preferably further includes: a decision result output circuit for receiving the test data responsive to a control signal indicating a test data reception state, deciding whether the test data received is correct or erroneous, and outputting a result of the decision; and a testing standby circuit for blocking the output of an output signal responsive to a control signal indicating a testing standby state.

A second IC functional block according to the present invention includes a decision result output circuit for receiving test data responsive to a control signal indicating a test data reception state, deciding whether the test data received is correct or erroneous, and outputting a result of the decision.

According to the second IC functional block, a decision result output circuit for receiving test data and deciding whether the test data received is correct or erroneous is provided within the IC functional block. Thus, if a semiconductor integrated circuit is constructed of the block and another IC functional block including a circuit that can output the test data, then the test data can be transmitted and received even when the user does not know much about the internal configuration and operation of the IC functional blocks. Accordingly, even if IC functional blocks are combined or the circuit sizes of the IC functional blocks are huge, a test among the IC functional blocks can be carried out easily and accurately in the semiconductor integrated circuit.

In the second IC functional block, the decision result output circuit preferably includes a plurality of expected value comparing sections, each comparing the test data to an expected value of the test data. In such an embodiment, even if a plurality of mutually different test data are received while a semiconductor integrated circuit including the second IC functional block is being tested, the decision can be performed correctly.

In the second IC functional block, the decision result output circuit preferably outputs the decision result on deciding that the test data is erroneous. In such an embodiment, as soon as the second IC functional block has received abnormal test data, which is different from the expected value thereof, while a semiconductor integrated circuit including the second IC functional block is being tested, the presence/absence of the fault can be estimated outside of the functional block.

In the second IC functional block, the decision result output circuit preferably includes holding means for holding the decision result thereon. In such an embodiment, while a semiconductor integrated circuit including the second IC functional block is being tested, it is possible to determine whether or not there is any fault by monitoring, from the outside of the functional block, a decision result signal, indicating that the second IC functional block has received abnormal test data, either when the testing ends or every time a predetermined interval has passed. Accordingly, batch processing can be carried out for the testing purposes.

In the second IC functional block, the holding means is preferably a shift register. In such an embodiment, even if the decision result signal is found to be a bit pattern as a result of monitoring the decision result signal from the outside of the functional block, the bit pattern of the decision result signal can be output in its entirety without getting the decision result signal stuck at one-bit information representing only the presence or absence of a fault. Accordingly, the test data received can be monitored in detail on a bit-by-bit basis. Furthermore, since the number of output pins required is only one, no burden is constituted on the interconnection region.

The second IC functional block preferably further includes a testing standby circuit for blocking the output of an output signal responsive to a control signal indicating a testing standby state.

A third IC functional block according to the present invention includes a testing standby circuit for blocking the output of an output signal responsive to a control signal indicating a testing standby state.

According to the third IC functional block, a testing standby circuit for blocking the output of an output signal responsive to a control signal indicating a testing standby state is provided within the IC functional block. Thus, if a semiconductor integrated circuit is constructed of the block and another IC functional block including a circuit that can output the test data and a decision result output circuit for deciding whether the test data received is correct or erroneous, then testing can be performed between these blocks more accurately. This is because it is possible to prevent the test data from colliding against each other on a signal line that is shared between the blocks. As a result, the test data can be transmitted and received even when the user does not know much about the internal configuration and operation of the IC functional blocks. Accordingly, even if IC functional blocks are combined or the circuit sizes of the IC functional blocks are huge, a test among the IC functional blocks can be carried out easily and accurately in the semiconductor integrated circuit.

A semiconductor integrated circuit according to the present invention accomplishes the first and second objects. The semiconductor integrated circuit includes: a first functional block including a test data output circuit for outputting test data responsive to a first control signal indicating a test data transmission state; a second functional block for integrated circuit, including a decision result output circuit for receiving the test data responsive to a second control signal indicating a test data reception state, deciding whether the test data received is correct or erroneous, and outputting a result of the decision; a test control output section for outputting the first and second control signals to the first and second IC functional blocks, respectively; and a test result output circuit for receiving a decision result signal from the decision result output circuit and outputting the received decision result signal as a test result signal.

In the semiconductor integrated circuit according to the present invention, by externally operating the test control output section, the test data can be output from the first IC functional block and can be received by the second IC functional block, in which it is decided whether the test data is correct or erroneous by comparing it to its expected value. And the result of the decision can be monitored from the outside. Accordingly, even if IC functional blocks are combined or the circuit sizes of the IC functional blocks are huge, a test among the IC functional blocks, of which the semiconductor integrated circuit is made up, can be carried out easily and accurately.

The semiconductor integrated circuit of the present invention preferably further includes: an output signal line including a plurality of signal paths interconnecting the first and second IC functional blocks together; and a switching circuit, which is connected to the output signal line, for switching the signal paths by selecting one of the signal paths. The test data output circuit preferably outputs a path control signal for controlling the switching circuit. In such an embodiment, even if the output signal line interconnecting the first and second IC functional blocks together is designed to have a plurality of signal paths, the respective signal paths of the output signal line can be tested with more certainty.

In the semiconductor integrated circuit of the present invention, the test result output circuit preferably outputs the test result on receiving the decision result. In such an embodiment, as soon as the IC functional block has received abnormal test data, which is different from the expected value thereof, the presence/absence of a fault can be estimated outside of the semiconductor integrated circuit.

In the semiconductor integrated circuit of the present invention, the test result output circuit preferably includes holding means for holding the decision result thereon. In such an embodiment, it is possible to determine whether or not there is any fault by monitoring, from the outside of the semiconductor integrated circuit, a decision result signal, indicating that the IC functional block has received abnormal test data, either when the testing ends or every time a predetermined interval has passed. Accordingly, batch processing can be carried out for the testing purposes.

The semiconductor integrated circuit of the present invention preferably further includes a third IC functional block, including a testing standby circuit for blocking the output of an output signal responsive to a third control signal indicating a testing standby state. And the test control output section preferably outputs the third control signal to the third IC functional block. In such an embodiment, even if an inter-block signal line is shared in common between the third and first IC functional blocks, it is possible to prevent the signals from colliding against each other, because the third IC functional block is made to enter a standby state. As a result, the inter-block signal line can be tested more accurately.

The semiconductor integrated circuit of the present invention preferably further includes: an output signal line including a plurality of signal paths interconnecting one of the first, second and third IC functional blocks to the other ones; and a switching circuit, which is connected to the output signal line, for switching the signal paths by selecting one of the signal paths. The test data output circuit preferably outputs a path control signal for controlling the switching circuit.

The semiconductor integrated circuit of the present invention preferably includes a plurality of the second IC functional blocks. Each said second IC functional block preferably includes a shift register for holding the decision result thereon. And the shift registers are preferably connected together to constitute a single shift register. In such an embodiment, even if the decision result signal is found to be composed of a plurality of bit patterns as a result of monitoring the decision result signal from the outside of the semiconductor integrated circuit, all the bit patterns of the respective IC functional blocks, which are waiting for the output of the decision result, can be output continuously by coupling the first shift registers together and without getting the decision result signal stuck at one-bit information representing only the presence or absence of fault. Accordingly, the test data received can be monitored in detail on a bit-by-bit basis. Furthermore, since the number of output pins required is only one, no burden is constituted on the interconnection region.

A method for testing a semiconductor integrated circuit according to the present invention accomplishes the first and second objects. The semiconductor integrated circuit includes: a first functional block including a test data output circuit for outputting test data responsive to a first control signal indicating a test data transmission state; a second functional block for integrated circuit, including a decision result output circuit for receiving the test data responsive to a second control signal indicating a test data reception state, deciding whether the test data received is correct or erroneous, and outputting a result of the decision; a third functional block for integrated circuit, including a testing standby circuit for blocking the output of an output signal responsive to a third control signal indicating a testing standby state; a test control output section for outputting the first, second and third control signals to the first, second and third IC functional blocks, respectively; and a test result output circuit for receiving a decision result signal from the decision result output circuit and outputting the received decision result signal as a test result signal. The method includes: a test data transmitting step for making the test control output section output the first control signal to make the test data output circuit of the first IC functional block output the test data; a test data receiving step for making the test control output section output the second control signal to make the decision result output circuit of the second IC functional block, which is connected to the first IC functional block, receive the test data; a testing standby step for making the test control output section output the third control signal to make the testing standby circuit of the third IC functional block, which is connected to the first IC functional block, block the output; and a test result reading step for reading the test result from the test result output circuit.

In the method for testing a semiconductor integrated circuit according to the present invention, the connection between the first and second IC functional blocks can be tested by making the first IC functional block enter test data transmission state and the second IC functional block, which is connected to the first IC functional block, enter test data reception state, respectively. And at the same time, the third IC functional block is made to enter standby state. Thus, it is possible to prevent the signal, supplied from the third IC functional block, from colliding against the test data. Accordingly, even if IC functional blocks are combined or the circuit sizes of the IC functional blocks are huge, a test among the IC functional blocks, which the semiconductor integrated circuit is made up of, can be carried out easily and accurately.

In the method for testing a semiconductor integrated circuit according to the present invention, the test data output circuit preferably includes a plurality of output signal lines enabling parallel output. The test data transmitting step preferably includes: an initial signal line dividing step for dividing the output signal lines into two groups and outputting the test data through the output signal lines such that the respective groups divided have mutually different values, which change from one value into the other; a signal line dividing step for dividing each said group into two groups and outputting the test data through the output signal lines such that the respective groups divided have mutually different values, which change from one value into the other; and a testing step for repeatedly performing the signal line dividing step until the output signal line belonging to each said group is no longer divisible. In such an embodiment, the second object is accomplished. First, the IC functional blocks are divided into two groups in the initial signal line dividing step, and test data with mutually different values, e.g., 0 and 1, are output through the pair of groups adjacent to each other. In addition, the test data is output to change alternately on the time axis, e.g., from 0 into 1 or from 1 into 0. And if testing is performed as in the initial signal line dividing step with the divisor increased one by one every time until each group is no longer divisible, then a fault resulting from the interference by an adjacent signal line, e.g., delay or crosstalk, can be detected from any combination of adjacent output signal lines. That is to say, there is no need to consider a combination of adjacent output signal lines in advance.

A method for designing a semiconductor integrated circuit according to the present invention is adapted to design a semiconductor integrated circuit using a plurality of IC functional blocks. Each said IC functional block performs a predetermined function of a logic or memory circuit. The method includes: a functional block designing step for introducing, into each of the IC functional blocks, at least one of a test data output circuit for outputting test data responsive to a control signal indicating a test data transmission state, a decision result output circuit for receiving the test data responsive to a control signal indicating a test data reception state, deciding whether the test data received is correct or erroneous, and outputting a result of the decision and a testing standby circuit for blocking the output of an output signal responsive to a control signal indicating a testing standby state; a functional block library forming step for forming a library of functional blocks by registering the IC functional blocks, which have been made in the functional block designing step, at the library; and a functional block selecting step for selecting such an IC functional block as enabling a desired semiconductor integrated circuit from the IC functional blocks that are included in the library of functional blocks.

In the method for designing a semiconductor integrated circuit according to the present invention, the first through third IC functional blocks and semiconductor integrated circuit according to the present invention can be implemented just as designed.

Also, a testing-dedicated functional block for integrated circuit, which is made up of only the test data output circuits or decision result output circuits and does not include any circuits performing a predetermined function such as a logic or memory circuit, may be built. And a semiconductor integrated circuit may be constructed by combining the testing-dedicated functional block for integrated circuit with an IC functional block including the circuits with a predetermined function. Then, the connection between the IC functional blocks including the circuit with a predetermined function can be tested without increasing the circuit size thereof.

As described above, in the functional block for integrated circuit, semiconductor integrated circuit using the IC functional block, and respective methods for testing and designing the semiconductor integrated circuit according to the present invention, the number of steps of generating test data can be reduced in designing a semiconductor integrated circuit using IC functional blocks, which are combined or have an internal configuration about which much isn't known or have a large circuit size. Accordingly, a test among the IC functional blocks, of which a semiconductor integrated circuit is made up, can be carried out easily and accurately. As a result, semiconductor integrated circuits are obtained with the fraction defective thereof reduced.

BRIEF DESCRIPTION OF DRAWINGS

FIG. 5 is a table illustrating test data patterns used for testing semiconductor integrated circuits according to the first, fifth, sixth, eighth and ninth embodiments of the present invention.

FIG. 11 is a table illustrating test data patterns used for testing a semiconductor integrated circuit according to the third embodiment of the present invention.

FIGS. 15(a) through 15(c) are tables illustrating output patterns of test data used for testing a semiconductor integrated circuit according to a fourth modified example of the third embodiment of the present invention.

FIG. 16 is a table illustrating test data patterns used for testing semiconductor integrated circuits according to fourth and fifth embodiments of the present invention.

FIG. 23 is a table illustrating test data patterns used for testing the semiconductor integrated circuit according to the tenth embodiment of the present invention.

FIG. 24 is a table illustrating test data patterns used for testing the semiconductor integrated circuit according to the tenth embodiment of the present invention.

BEST MODE FOR CARRYING OUT THE INVENTION

An IC functional block, which is the object of the present invention, may be a so-called "macro cell" composed of logic circuits, RAMs, ROMs, ALUs, etc. It should be noted, however, that the block may be a functional block for a semiconductor integrated circuit, which is called "IP (intellectual property)", "VC (virtual component)" or "core".

First Embodiment

A first embodiment of the present invention will be described with reference to the drawings.

Figure 1:
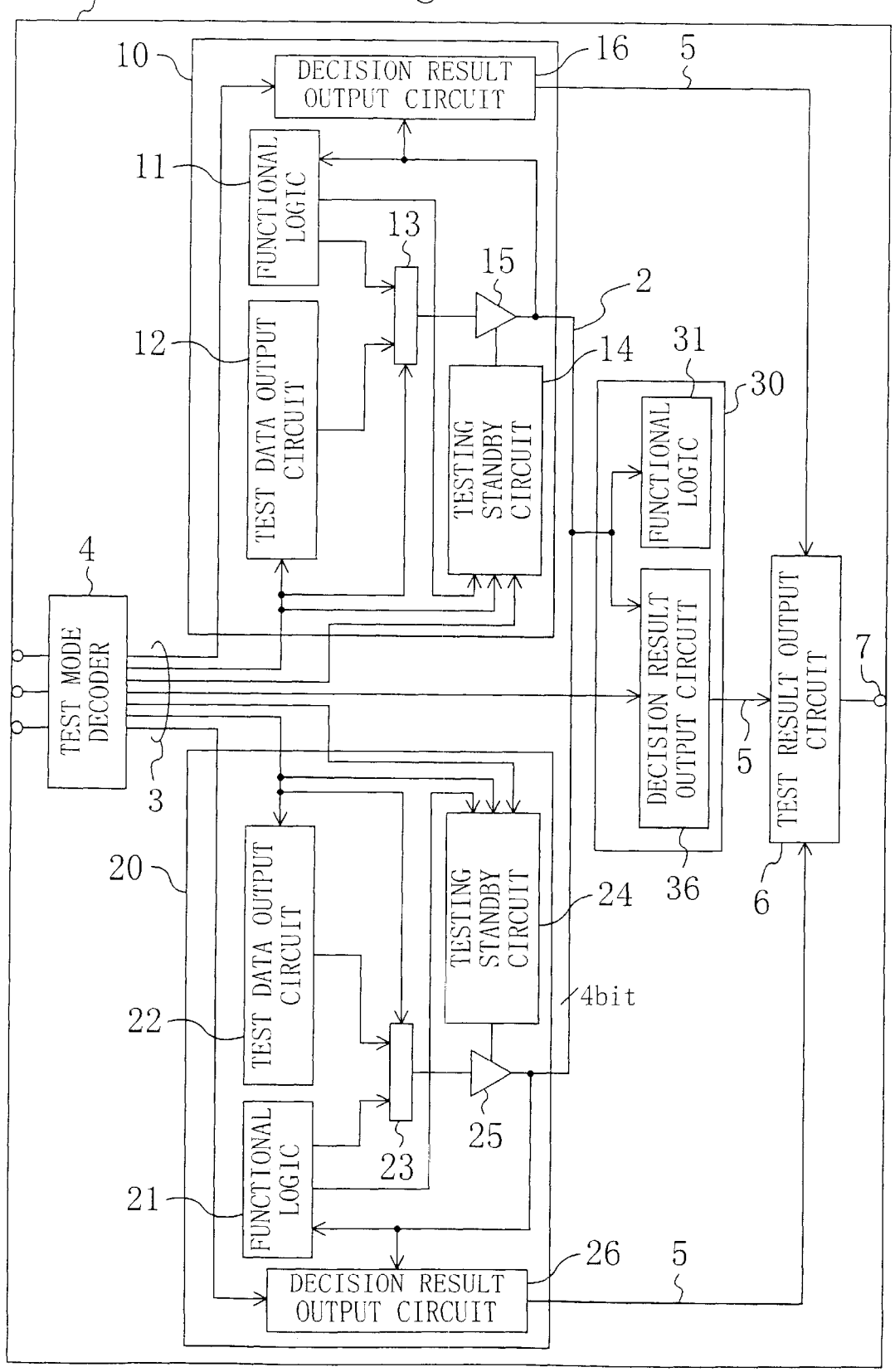
FIG. 1 is a circuit diagram illustrating IC functional blocks and a semiconductor integrated circuit, which is made up of the IC functional blocks, according to a first embodiment of the present invention.

FIG. 1 illustrates a circuit configuration of functional blocks for integrated circuit and a semiconductor integrated circuit, which is made up of the functional blocks for integrated circuit, according to a first embodiment of the present invention. As shown in FIG. 1, the semiconductor integrated circuit 1 includes first, second and third functional blocks 10, 20, 30 for integrated circuit (hereinafter, simply referred to as "functional blocks"), for example. These functional blocks 10, 20 and 30 are coupled together via a 4-bit inter-block signal line 2. In this example, the inter-block signal line 2 is connected to bidirectional pins (not shown) of the first and second functional blocks 10 and 20 and to an input pin (not shown) of the third functional block 30.

The semiconductor integrated circuit 1 further includes a test mode decoder 4, which is implemented as an exemplary test control output section for receiving an external control signal and outputting a test control signal through test control signal lines 3 to these functional blocks 10, 20 and 30. The semiconductor integrated circuit 1 further includes a test result output circuit 6, which receives a decision result signal including information about the test results from the functional blocks 10, 20 and 30 through a decision result signal line 5 and outputs the input decision result signal as a test result signal to an external terminal 7.

The first functional block 10 includes: a logic circuit 11 performing the predetermined function of the first functional block 10 and outputting its result; a test data output circuit 12, which operates during testing and outputs a predetermined test data pattern; a selector 13 for selectively outputting either the output signal of the logic circuit 11 or that of the test data output circuit 12; a testing standby circuit 14, which is connected between the selector 13 and bidirectional pin and makes the functional block enter a standby state during testing; a tristate buffer 15 that is made to have a high impedance by the testing standby circuit 14; and a decision result output circuit 16, which receives a test data pattern from the second functional block, compares the received test data pattern to an expected value stored therein, and outputs a decision result signal thereof to the decision result signal line 5.

The second functional block 20 has a different layout than that of the first functional block 10, but includes the same components as the first functional block 10. That is to say, the second functional block 20 also includes logic circuit 21, test data output circuit 22, selector 23, testing standby circuit 24, tristate buffer 25 and decision result output circuit 26.

The third functional block 30 includes only a logic circuit 31 and a decision result output circuit 36. In this example, the test data output circuits 12, 22, selectors 13, 23, testing standby circuits 14, 24 and decision result output circuits 16, 26, 36 are connected to the test control signal lines 3.

Figure 2:
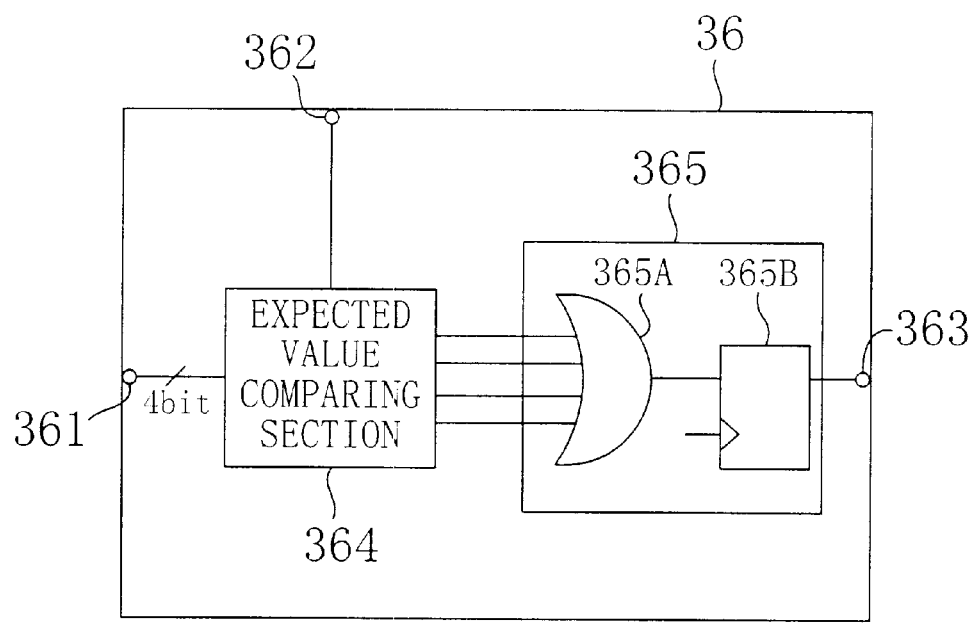
FIG. 2 is a circuit diagram illustrating a decision result output circuit of the IC functional block according to the first embodiment of the present invention.

FIG. 2 illustrates an exemplary decision result output circuit 16, 26, 36 of the functional block according to this embodiment. For example, the decision result output circuit 36 included in the third functional block 30 includes: a test data input terminal 361, at which the test data pattern is input from the inter-block signal line 2; a control signal input terminal 362, which is connected to the test control signal line 3; and an output terminal 363, through which the decision result signal is output as shown in FIG. 2.

The decision result output circuit 36 includes: an expected value comparing section 364, which receives the test control signal and test data pattern through the control signal and test data input terminals 362, 361, respectively, compares the input test data pattern on a bit-by-bit basis to the expected values that have been stored and standardized in advance, and outputs disagreeing bits as HIGH data when output as parallel data; and a latch section 365 for instantaneously outputting the result of comparison as a decision result signal to the test result output circuit 6.

The latch section 365 may include: an OR circuit 365A with such a number of input terminals as corresponding to the bit width of the test data pattern; and a flip-flop circuit 365B. The OR circuit 365A gets the decision result signal, which has been supplied from the expected value comparing section 364, stuck at one bit and then outputs it to the flip-flop circuit 365B.

Figure 3:
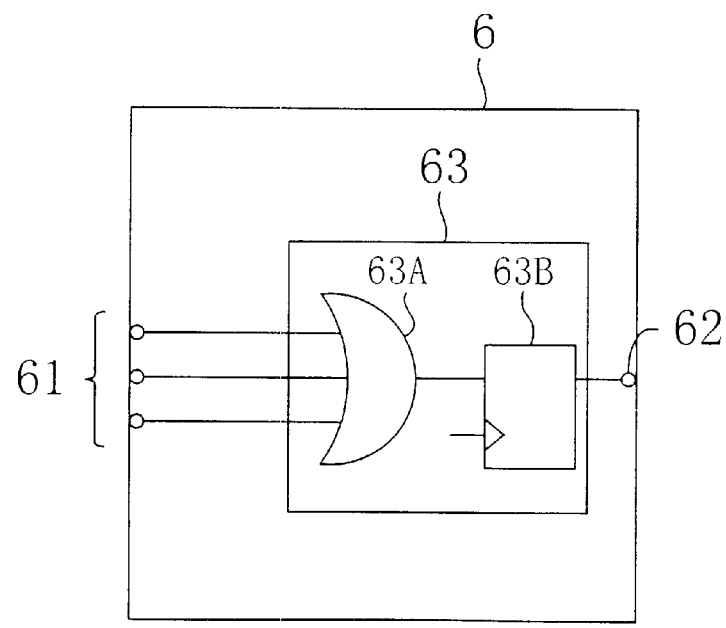
FIG. 3 is a circuit diagram illustrating a test result output circuit of the IC functional block according to the first embodiment of the present invention.

FIG. 3 illustrates an exemplary test result output circuit 6 of the semiconductor integrated circuit according to this embodiment. As shown in FIG. 3, the test result output circuit 6 includes: decision result signal input terminals 61, at which decision result signals are input through the decision result signal line 5; and an output terminal 62 for outputting the input decision result signal as a test result signal therethrough.

The test result output circuit 6 includes a latch section 63 for receiving and latching the decision result signals in parallel through the decision result signal input terminals 61 and then outputting them to the outside instantaneously.

The latch section 63 may include: an OR circuit 63A with the same number of input terminals as that of the decision result signal input terminals 61; and a flip-flop circuit 63B. The OR circuit 63A gets the test result signal stuck at one bit and then outputs it to the flip-flop circuit 63B.

Hereinafter, a method for testing the semiconductor integrated circuit 1 with the above configuration, specifically, a method for detecting a fault from the inter-block signal line 2 between the first and second functional blocks 10 and 20, will be described with reference to the drawings.

Figure 4:
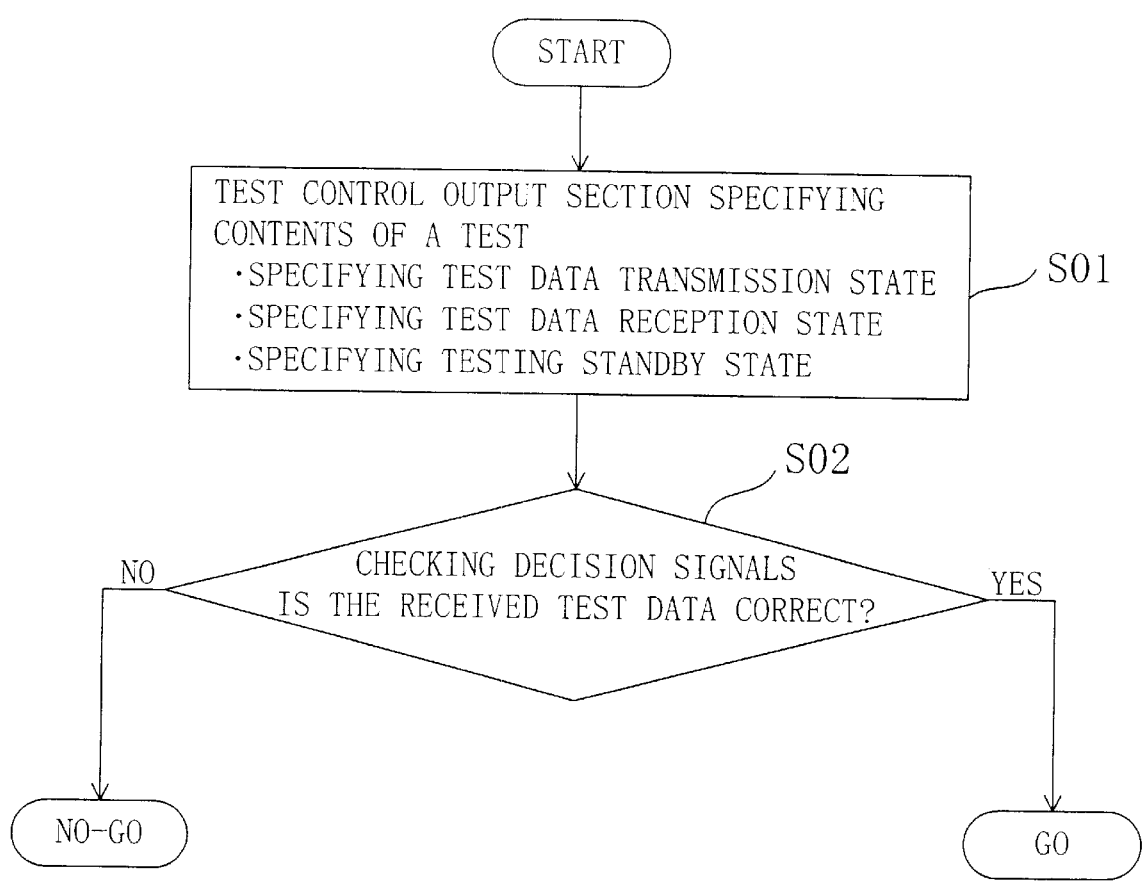
FIG. 4 is a flowchart illustrating a method for testing a semiconductor integrated circuit according to the first embodiment of the present invention.

FIG. 4 illustrates a flowchart of a method for testing the semiconductor integrated circuit according to the first embodiment of the present invention. As shown in FIG. 4, first, in a test control signal outputting step S01, control signals are sent to the test mode decoder 4 of the semiconductor integrated circuit 1 shown in FIG. 1, thereby transmitting predetermined test control signals to the respective components through the test control signal lines 3. For example, a first test control signal may be transmitted to the first functional block 10, thereby making the block 10 enter a test data transmission state. A third test control signal may be transmitted to the second functional block 20, thereby making the block 20 enter a testing standby state. And a second test control signal may be transmitted to the third functional block 30, thereby making the block 30 enter a test data reception state.

Then, in the first functional block 10 shown in FIG. 1, the test data output circuit 12 is activated and the testing standby circuit 14 is deactivated. As a result, a test data pattern, which has been prepared and standardized in advance, is output through the inter-block signal line 2 to the third functional block 30. In the second functional block 20, the testing standby circuit 24 is activated. Accordingly, the tristate buffer 25 is made to enter a high-impedance state so that no signal is output to the inter-block signal line 2. In the third functional block 30, the decision result output circuit 36 is activated and the block 30 gets ready to receive the test data pattern from the first functional block 10.

Suppose the test data output circuit 12 of the first functional block 10 outputs the test data patterns shown in FIG. 5, for example. In this case, a test data pattern, where all of the 4-bit data are "1", is output at a time t1, and then another test data pattern, where all of the 4-bit data are "0", is output at a time t2. In these test data patterns, a bit pattern consisting of "1" bits only and a bit pattern consisting of "0" bits only are both propagated through the inter-block signal line 2. Alternatively, a bit pattern of "0" bits may be transmitted first, and then a bit pattern of "1" bits may be transmitted.

On the other hand, the decision result output circuit 36 of the third functional block 30 shown in FIG. 1 determines, through comparison, whether or not the test data patterns shown in FIG. 5 arrived at times t1 and t2, respectively, latches the results therein and then outputs the results to the test result output circuit 6 through the decision result signal line 5. The test result output circuit 6 receives the decision result signal from the decision result output circuit 36, latches the decision result signal received therein and then outputs it to the external output terminal 7 of the semiconductor integrated circuit 1.

Next, in a go/no-go determination step S02 shown in FIG. 4, which is equivalent to the test result readout step, the decision signals, which are supplied from the test result output circuit 6 for the test data patterns output at the times t1 and t2, are checked using an external monitor or the like electrically connected to the semiconductor integrated circuit 1. If one of the decision signals associated with the times t1 and t2 turns out to have an abnormal value, then the semiconductor integrated circuit 1 under the test is evaluated defective, or "no-go". On the other hand, if the decision signals associated with the times t1 and t2 both turn out to have respective normal values, then the semiconductor integrated circuit 1 is evaluated "go" as for the test items about the test data patterns shown in FIG. 5.

As can be understood, even if the user does not know much about the configurations (i.e., the circuit or functional configurations) of the respective functional blocks 10, 20 and 30 or if the circuit sizes are too huge to produce test data with ease, the inter-block signal line 2 can be tested easily and accurately according to this embodiment.

It is noted that the first and second functional blocks 10 and 20 may enter testing standby and test data transmission states, respectively. That is to say, it is naturally possible to carry out a test with a desired combination.

Also, in the first and second functional blocks 10, 20, the logic circuits 11, 21 are used as exemplary circuits with predetermined functions. Alternatively, memory circuits, multiplier circuits, etc., may also be used.

Furthermore, the bit width of the inter-block signal line 2 is supposed to be 4 bits for the sake of simplicity. However, the present invention is in no way limited to any particular bit width, but is applicable to any desired bit width.

First Modified Example of First Embodiment

Hereinafter, a first modified example of the first embodiment of the present invention will be described with reference to the drawings.

Figure 6:
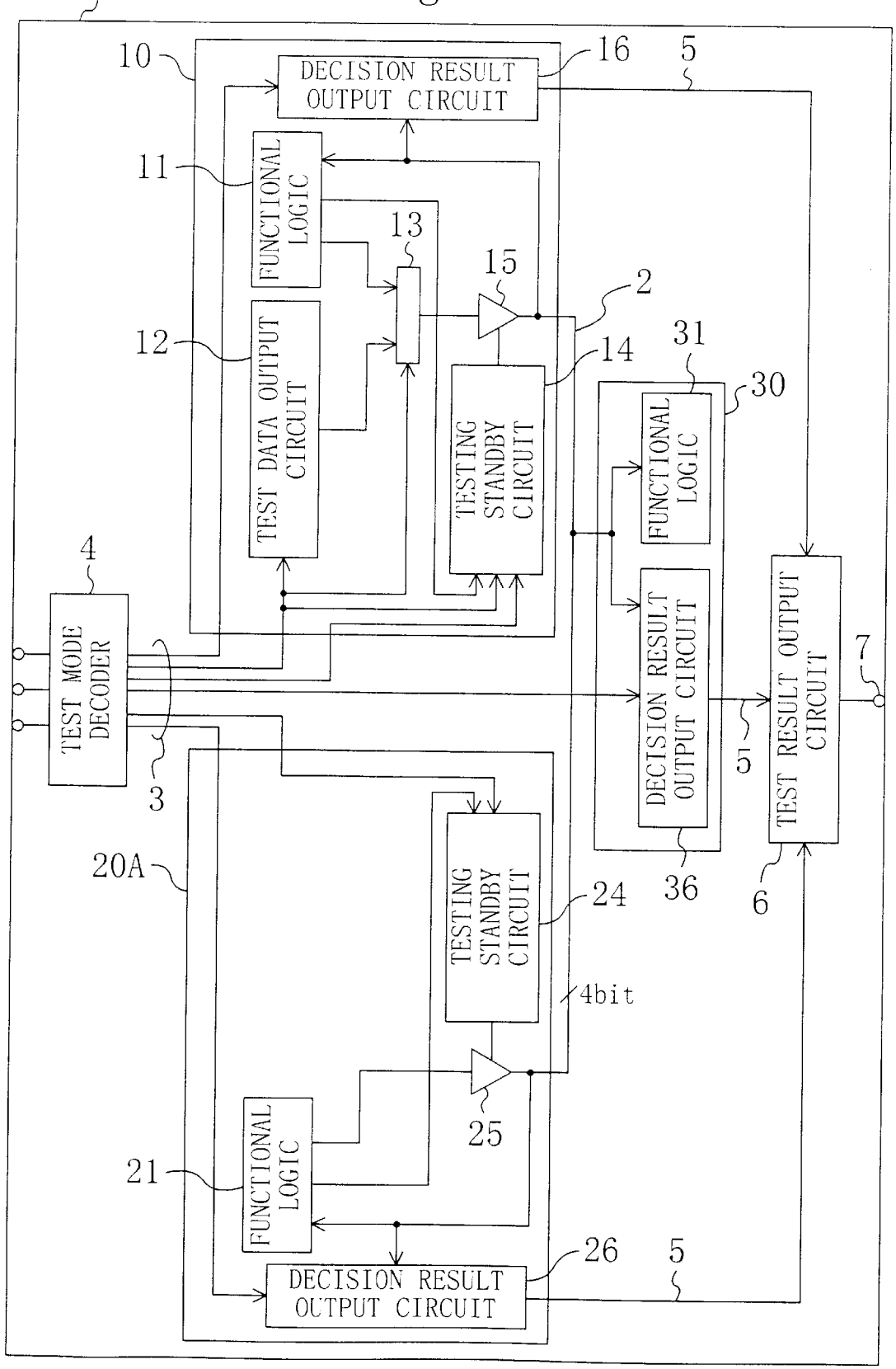
FIG. 6 is a circuit diagram illustrating IC functional blocks and a semiconductor integrated circuit, which is made up of the IC functional blocks, according to a first modified example of the first embodiment of the present invention.

FIG. 6 illustrates circuit configurations of functional blocks and a semiconductor integrated circuit, which is made up of these functional blocks, according to a first modified example of the first embodiment. In FIG. 6, the same components as those illustrated in FIG. 1 are identified by the same reference numerals and the description thereof will be omitted herein. The semiconductor integrated circuit 1 shown in FIG. 6 includes first, second and third functional blocks 10, 20A and 30. This embodiment is characterized in that only one of the functional blocks 10, 20A and 30 included in the semiconductor integrated circuit 1 includes the test data output circuit. In the illustrated example, only the first functional block 10 includes the test data output circuit 12 as shown in FIG. 6.

In this configuration, the total circuit size of the functional blocks can be reduced compared to providing the test data output circuits for all the functional blocks that are coupled together via the output or bidirectional pins. Accordingly, the inter-block signal line 2 can be tested in only one direction. However, this embodiment is effectively applicable to a situation where the circuit size of a semiconductor integrated circuit 1 to be designed must be reduced even if the coverage of the test items should be partially given up.

Second Modified Example of First Embodiment

Hereinafter, a second modified example of the first embodiment of the present invention will be described with reference to the drawings.

Figure 7:
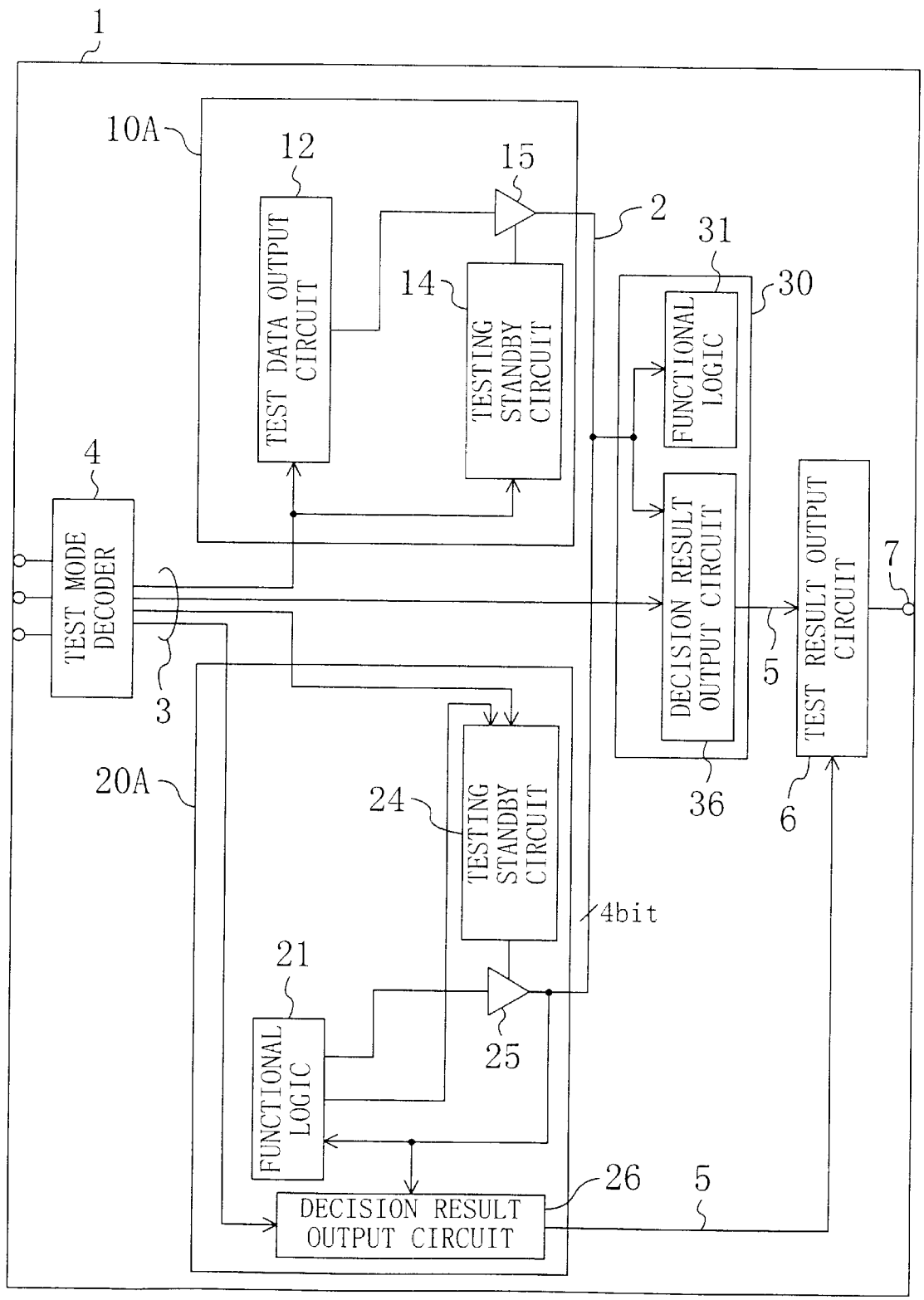
FIG. 7 is a circuit diagram illustrating IC functional blocks and a semiconductor integrated circuit, which is made up of the IC functional blocks, according to a second modified example of the first embodiment of the present invention.

FIG. 7 illustrates circuit configurations of functional blocks and a semiconductor integrated circuit, which is made up of these functional blocks, according to a second modified example of the first embodiment. In FIG. 7, the same components as those illustrated in FIG. 6 are identified by the same reference numerals and the description thereof will be omitted herein. The semiconductor integrated circuit 1 shown in FIG. 7 includes first, second and third functional blocks 10A, 20A and 30. This embodiment is characterized in that only one of the functional blocks 10A, 20A and 30 included in the semiconductor integrated circuit 1 includes the test data output circuit. This embodiment is further characterized in that the first functional block 10A is a testing-dedicated functional block not including any circuit with a predetermined function that is used during normal operation.

In this configuration, the inter-block signal line 2 can be tested by connecting the testing-dedicated first functional block 10A between the second and third functional blocks 20A and 30 including no test data output circuits. Accordingly, increase in circuit size can be suppressed.

Third Modified Example of First Embodiment

Hereinafter, a third modified example of the first embodiment of the present invention will be described with reference to the drawings.

Figure 8:
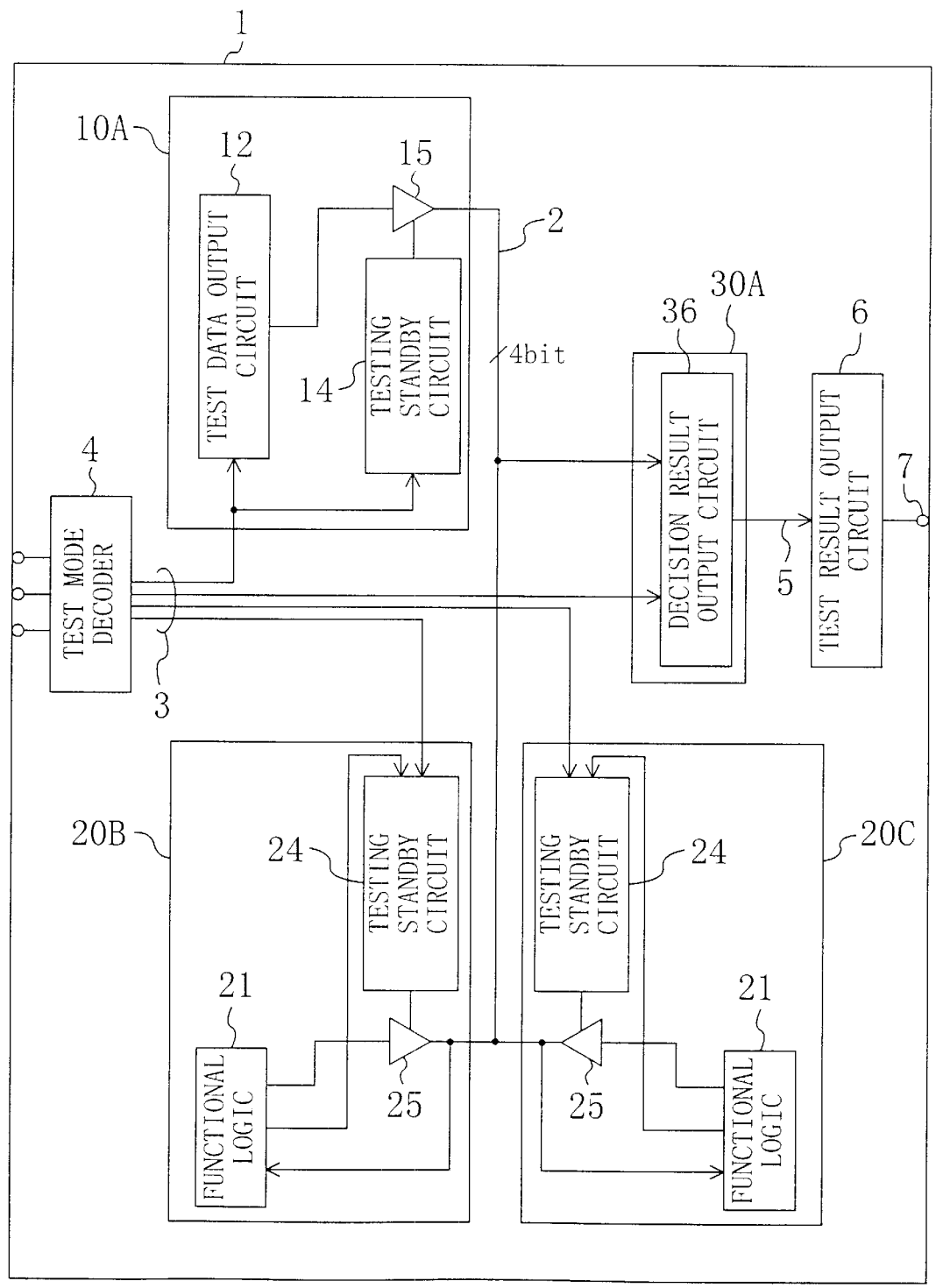
FIG. 8 is a circuit diagram illustrating IC functional blocks and a semiconductor integrated circuit, which is made up of the IC functional blocks, according to a third modified example of the first embodiment of the present invention.

FIG. 8 illustrates circuit configurations of functional blocks and a semiconductor integrated circuit, which is made up of these functional blocks, according to a third modified example of the first embodiment. In FIG. 8, the same components as those illustrated in FIG. 7 are identified by the same reference numerals and the description thereof will be omitted herein. The semiconductor integrated circuit 1 shown in FIG. 8 includes first, second, third and fourth functional blocks 10A, 20B, 20C and 30A. Neither the second nor third functional block 20B, 20C includes any test data output circuit or decision result output circuit. Also, the fourth functional block 30A is a testing-dedicated functional block, which includes no circuit with a predetermined function, but consists of only the decision result output circuit 36.

In this configuration, the inter-block signal line 2 can be tested by connecting the first and fourth functional blocks 10A and 30A, which are dedicated to the transmission and reception of test data, respectively, between the second and third functional blocks 20A and 20B including no test data output circuits. Accordingly, increase in circuit size can be further suppressed. That is to say, if the testing standby circuit 24 is built in the normal second and third functional blocks 20A, 20B, which both include respective circuits with predetermined functions, then the inter-block signal line 2 can be tested only by building in the first and fourth functional blocks 10A and 30A, which are dedicated to the transmission and reception of the test data, respectively, and by connecting these blocks 10A and 30A to the second and third functional blocks 20A and 20B, respectively, in the design of the semiconductor integrated circuit 1 while minimizing the increase in its circuit size.

Second Embodiment

Hereinafter, a second embodiment of the present invention will be described with reference to the drawings.

Figure 9:
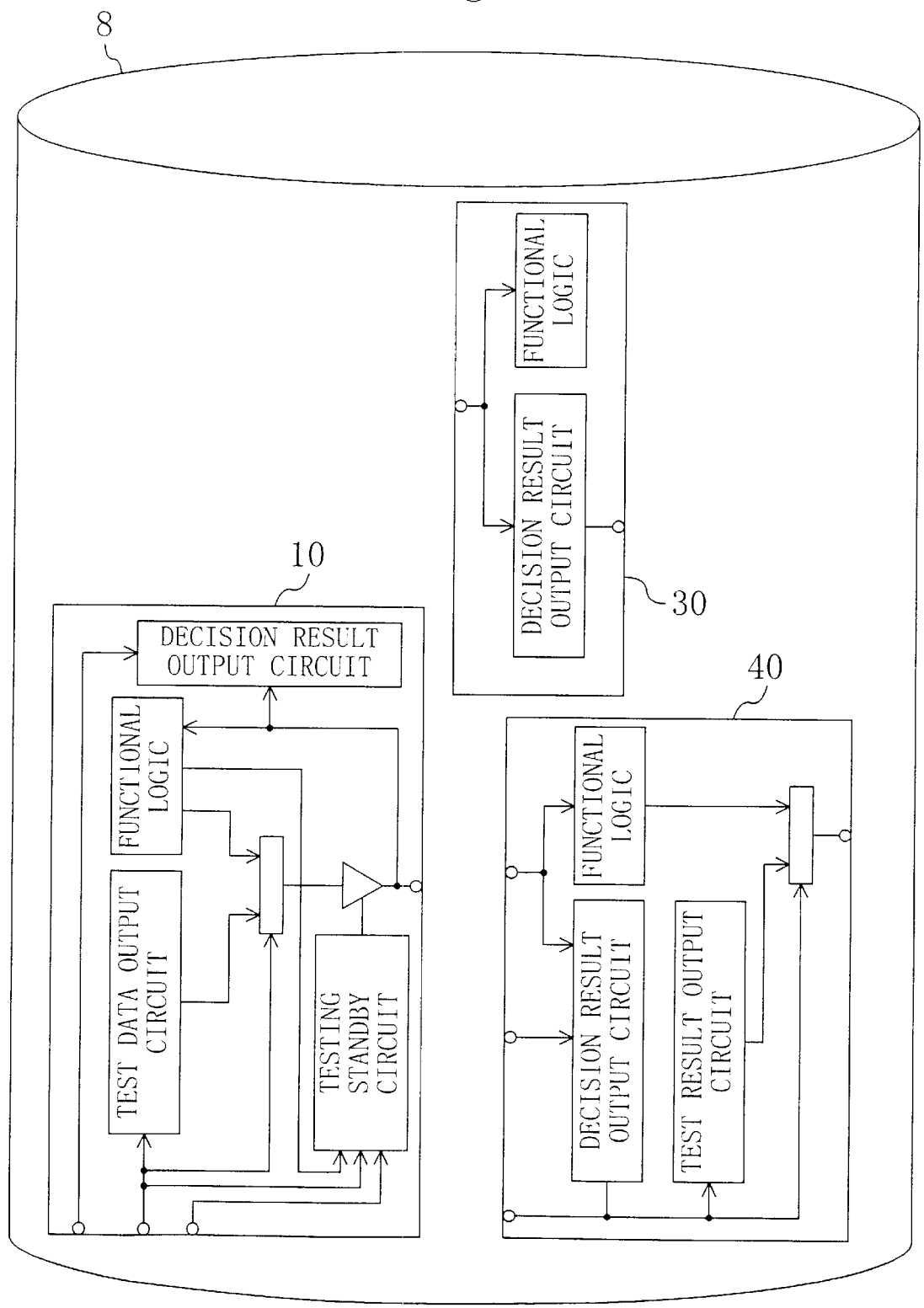
FIG. 9 is a schematic illustrating a library of IC functional blocks used in designing a semiconductor integrated circuit according to a second embodiment of the present invention.

FIG. 9 schematically illustrates a library used in designing a semiconductor integrated circuit according to a second embodiment of the present invention. In FIG. 9, a library of functional blocks, in which the functional blocks according to the present invention are registered, is identified by 8, the first functional block as described in the first embodiment by 10, the third functional block by 30 and a unidirectional functional block for outputting the result of a predetermined function by 40. Although not shown, the functional blocks as described in the first, second and third modified examples of the first embodiment, e.g., the testing-dedicated functional blocks in particular, may also be registered therein.

A method for designing a semiconductor integrated circuit using this functional block library 8 will be outlined.

First, in a functional block designing step, at least one of circuits with predetermined functions such as logic circuits, memory circuits, etc., test data output circuits, decision result output circuits and testing standby circuits is built in respective functional blocks to be components, thereby designing desired functional blocks.

Next, in a functional block library forming step, the functional blocks that have been designed in the functional block designing step are sequentially registered into a library.

Subsequently, in a functional block selecting step, functional blocks needed for a desired semiconductor integrated circuit are selected from these functional blocks in the functional block library. As a result, a desired semiconductor integrated circuit can be designed.

The functional blocks according to the present invention are registered in the functional block library. Accordingly, even if the maker of the functional blocks is different from the user of the library or if the circuit size is huge, a test among the functional blocks in the semiconductor integrated circuit designed using the designing method of this embodiment can be carried out easily and accurately.

Third Embodiment

Hereinafter, a third embodiment of the present invention will be described with reference to the drawings.

In this embodiment, circuit configuration of the test data output circuit and method for generating a test data pattern, which is output by the test data output circuit, will be described.

Figure 10:
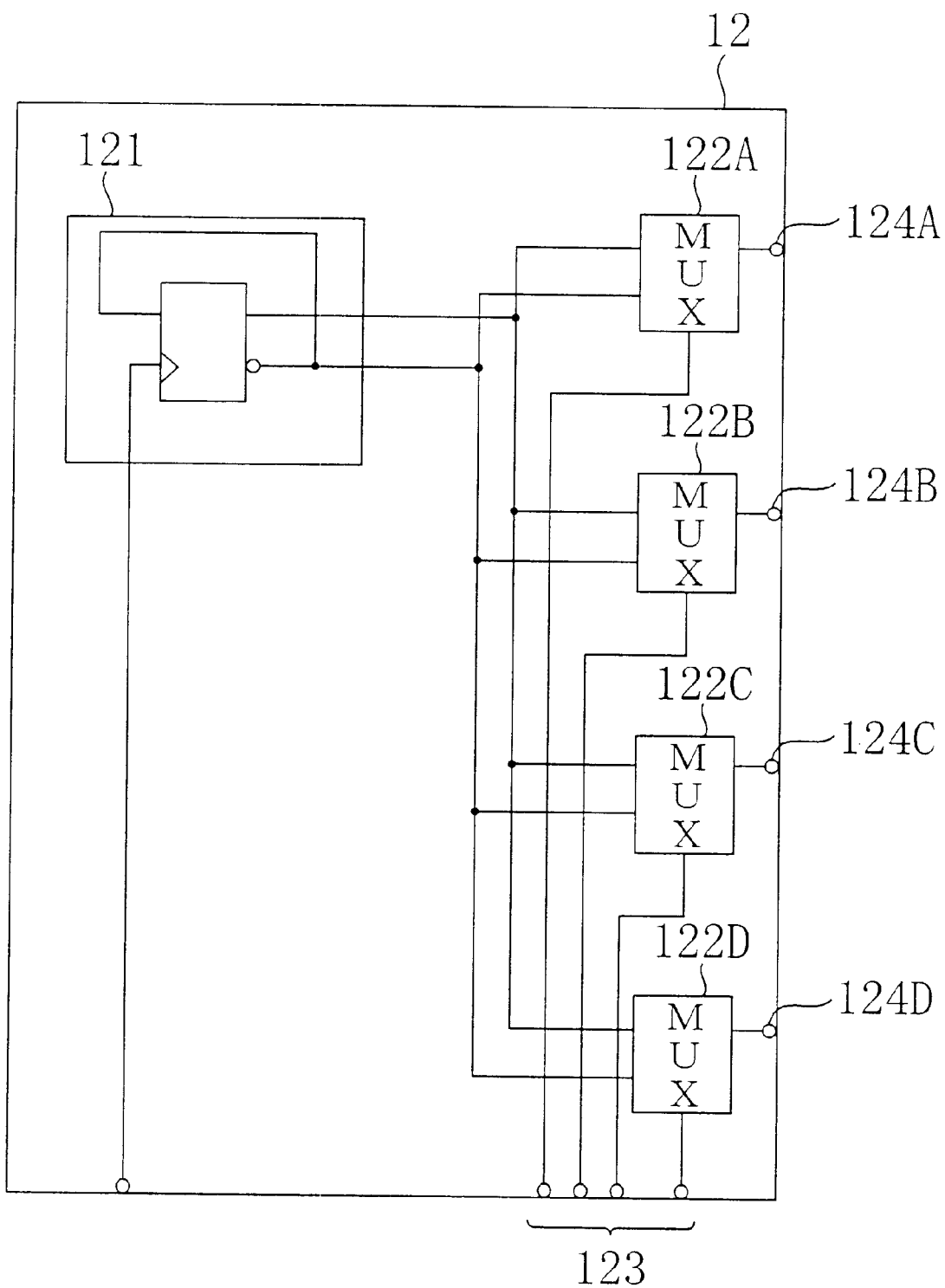
FIG. 10 is a circuit diagram illustrating a test data output circuit of an IC functional block according to a third embodiment of the present invention.

FIG. 10 illustrates a circuit configuration of a test data output circuit for a functional block according to a third embodiment of the present invention. As shown in FIG. 10, the test data output circuit 12 includes: an original data generating section 121 implemented as a flip-flop circuit with input terminal, non-inverting output terminal and inverting output terminal, in which the inverting output terminal is connected to the input terminal; and first, second, third and fourth selector circuits 122A, 122B, 122C and 122D implemented as multiplexers, each receiving non-inverted signal and inverted signal as first and second original data from the original data generating section 121.

The first through fourth selector circuits 122A through 122D are connected to associated selection signal input terminals 123, at which selection signals are externally input, and to first through fourth test data output terminals 124A through 124D, respectively, through which respective test data patterns are output. The first through fourth test data output terminals 124A through 124D are connected to respective output signal lines (not shown), through which associated test data patterns pass.

For example, suppose the non-inverted input signal is selected for the first and third selector circuits 122A and 122C and the inverted input signal is selected for the second and fourth selector circuits 122B and 122D in the test data output circuit 12 with such a configuration. Then, test data patterns such as those shown in FIG. 11, which show mutually opposite values, e.g., zeros and ones, on the inter-block signal lines 2 adjacent to each other in the layout of the semiconductor integrated circuit 1, and each bit of which is inverted on the time axis, can be generated.

In outputting such test data patterns as showing complementary relationship between the adjacent inter-block signal lines 2, if a shortcircuit fault is caused between an adjacent pair of inter-block signal lines 2, then the potentials on these lines are substantially equalized with each other and data on these lines gets stuck at one or zero. Thus, the decision result output circuit 36 shown in FIG. 1 receives abnormal test data, in which one of the four bits is inverted compared to the test data pattern transmitted.

Furthermore, the bits on each inter-block signal line 2 are output while being inverted on the time axis. That is to say, since signals with alternately changing levels, i.e., from 0 into 1 and then from 1 into 0, are adjacent to each other, crosstalk can be tested more accurately.

As described above, according to this embodiment, a shortcircuit fault or a fault resulting from the interference by an adjacent signal line, e.g., crosstalk, on an adjacent pair of inter-block signal lines 2, such as those connected to the first and second test data output terminals 124A and 124B, can be detected by testing accurately.

In this modified example, the bit width of the data is supposed to be 4 bits. If an even larger number of bits should be transmitted, then a desired number of selector circuits may to be connected in parallel to each other.

First Modified Example of Third Embodiment

Hereinafter, a first modified example of the third embodiment of the present invention will be described with reference to the drawings.

Figure 12:
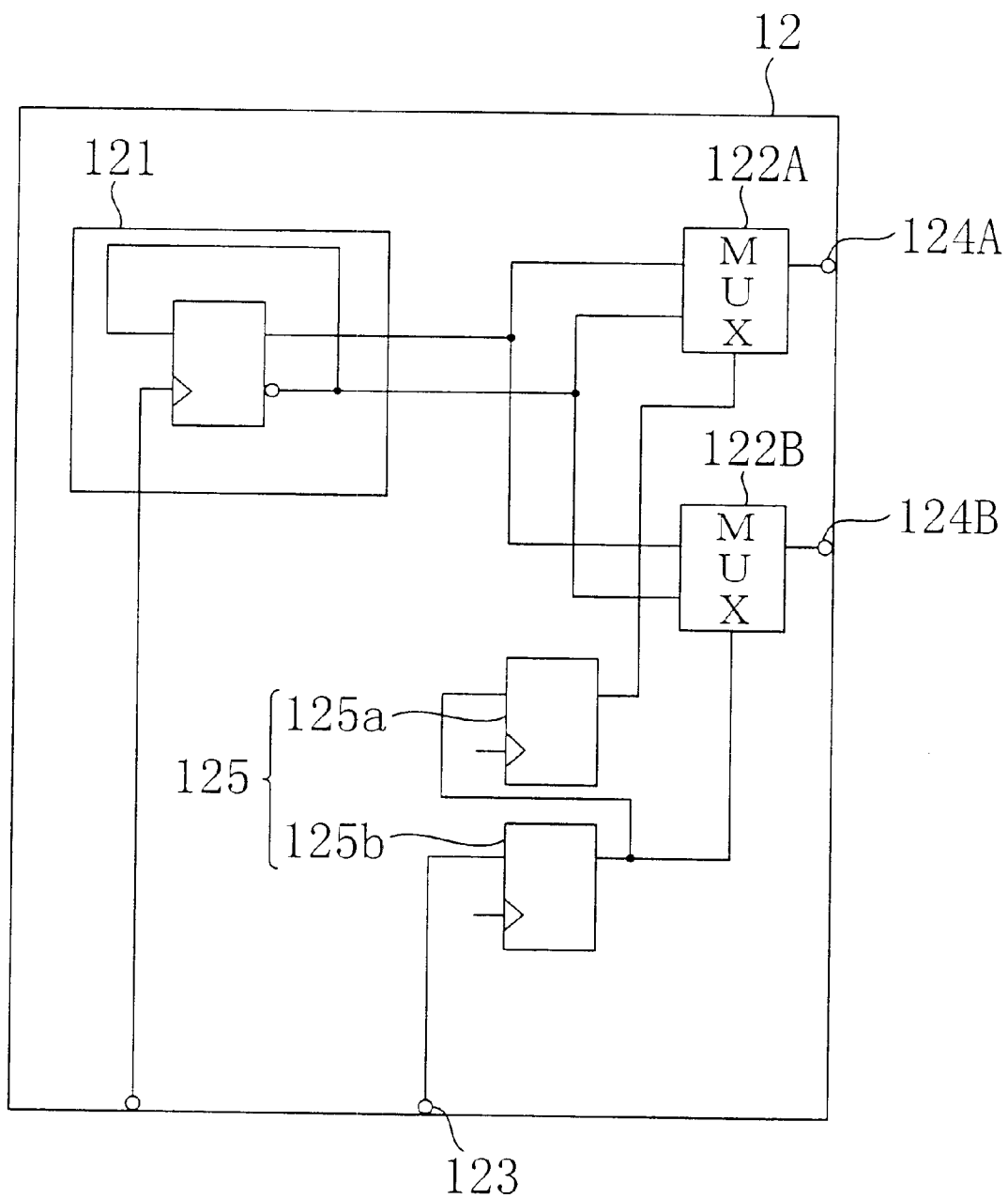
FIG. 12 is a circuit diagram illustrating a test data output circuit of an IC functional block according to a first modified example of the third embodiment of the present invention.

FIG. 12 illustrates a circuit configuration of a test data output circuit for a functional block according to a first modified example of the third embodiment. In FIG. 12, the same components as those illustrated in FIG. 10 are identified by the same reference numerals and the description thereof will be omitted herein. In this example, a two-bit configuration including only the first and second selector circuits 122A and 122B is shown due to limitations of space. This modified example is characterized in that first and second flip-flops 125a and 125b are inserted between the selection signal input terminal 123 and the first selector circuit 122A and between the selection signal input terminal 123 and the second selector circuit 122B to form a shift register 125.

In this configuration, the number of external pins for the selection signal input terminal 123 can be reduced. Thus, the area occupied by the interconnection lines for selection signals can be drastically cut down and no burden is constituted on the interconnection region of the circuit.

The shift register 125 does not have to be dedicated to testing. For example, a flip-flop within a logic circuit implementing functional logic may be used as the shift register 125 only during testing.

Second Modified Example of Third Embodiment

Hereinafter, a second modified example of the third embodiment of the present invention will be described with reference to the drawings.

Figure 13:
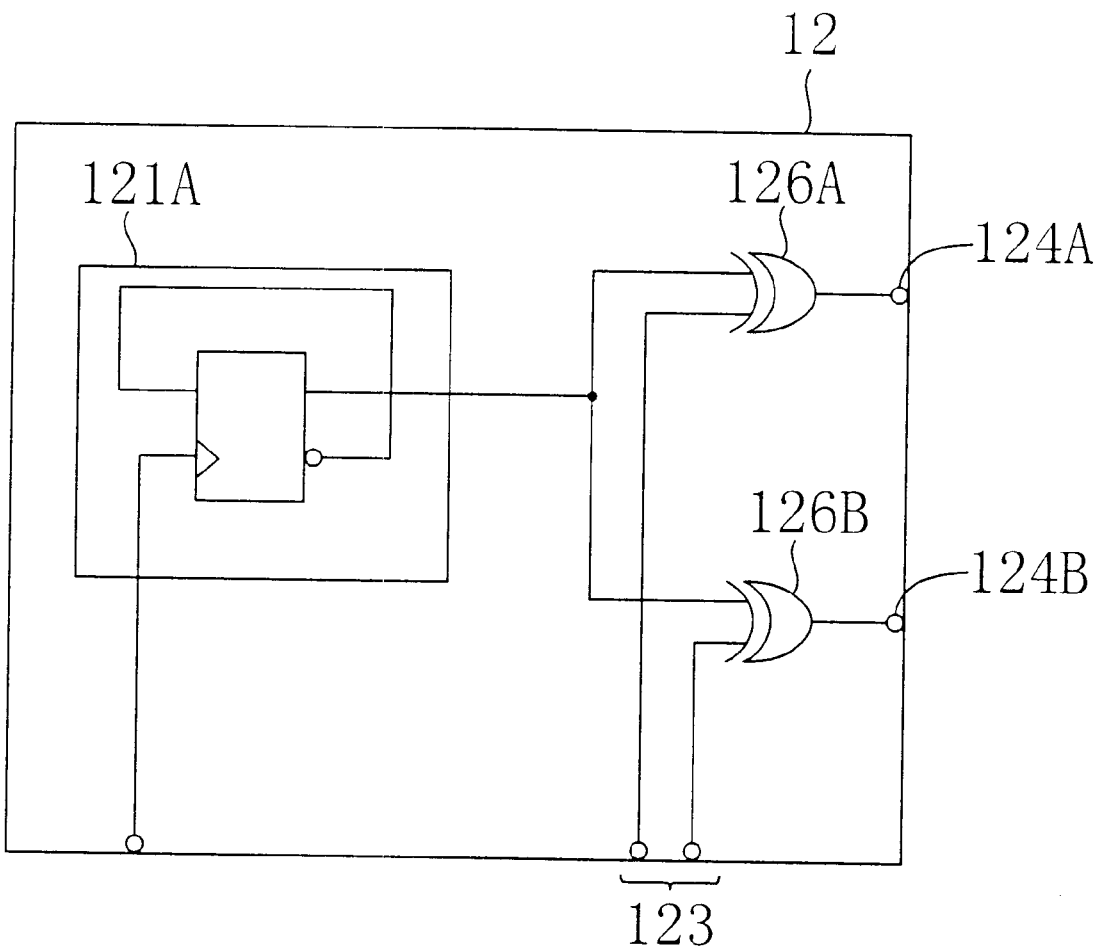
FIG. 13 is a circuit diagram illustrating a test data output circuit of an IC functional block according to a second modified example of the third embodiment of the present invention.

FIG. 13 illustrates a circuit configuration of a test data output circuit for a functional block according to a second modified example of the third embodiment. In FIG. 13, the same components as those illustrated in FIG. 12 are identified by the same reference numerals and the description thereof will be omitted herein. As shown in FIG. 13, the original data generating section 121A outputs only the original data through the non-inverting output terminal thereof. Also, in this configuration, the selection function of receiving the original data and establishing a complementary relationship between mutually adjacent signal lines is performed by first and second inverter circuits 126A and 126B implemented as exclusive-OR (XOR) circuits. Each inverter circuit 126A, 126B receives the original data at one of its input terminals and a selection signal at the other input terminal thereof. In the illustrated example, selection signals with a complementary relationship are input to the selection signal input terminals 123 such that the test data patterns have a complementary relationship.

In this configuration, no interconnections are needed for a signal from the inverting output terminal in the original data generating section 121A. In addition, since the circuit size of an XOR circuit is generally smaller than that of a selector, for example, no burden is constituted in designing the functional block and the semiconductor integrated circuit.

Third Modified Example of Third Embodiment

Hereinafter, a third modified example of the third embodiment of the present invention will be described with reference to the drawings.

Figure 14:
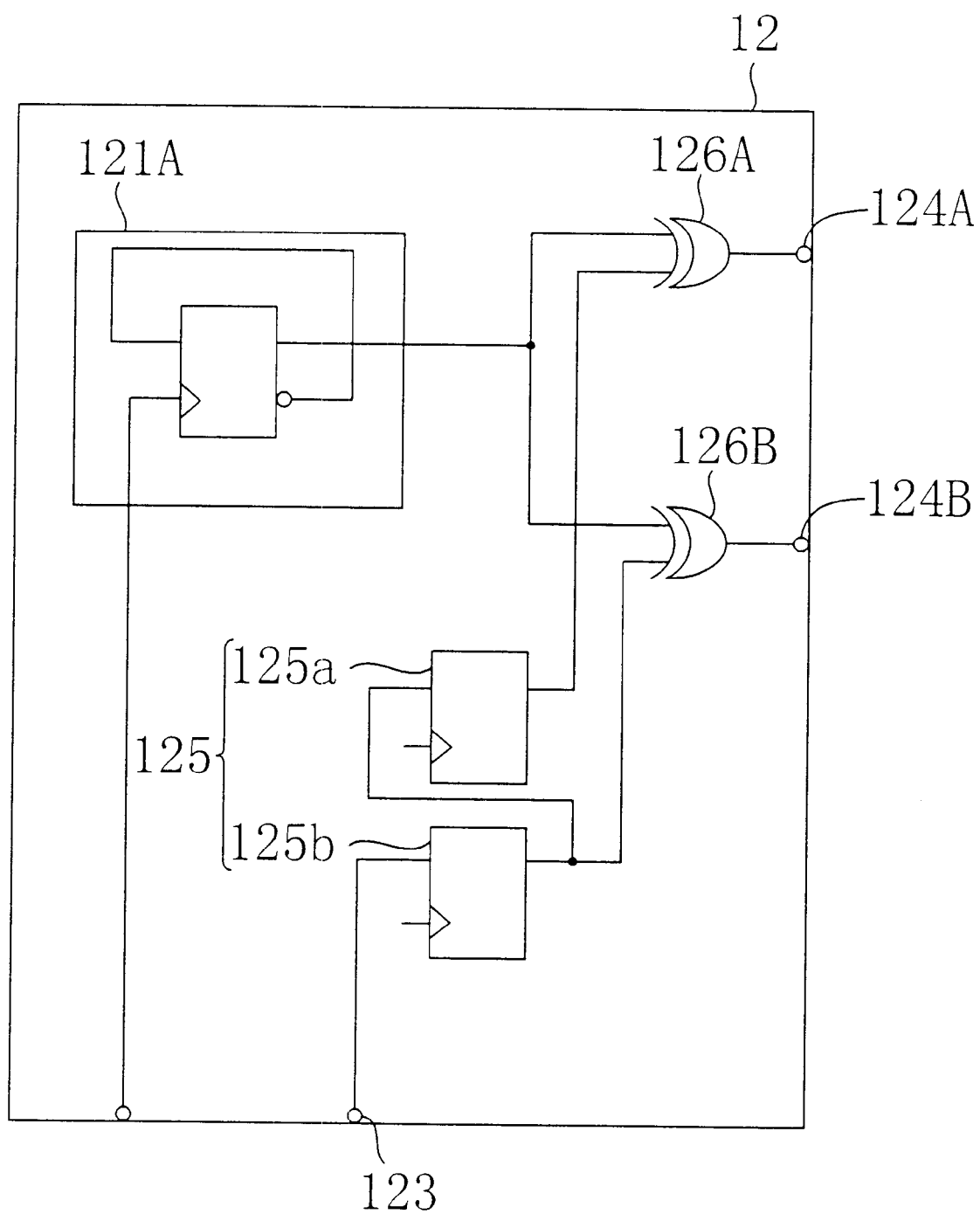
FIG. 14 is a circuit diagram illustrating a test data output circuit of an IC functional block according to a third modified example of the third embodiment of the present invention.

FIG. 14 illustrates a circuit configuration of a test data output circuit for a functional block according to a third modified example of the third embodiment. In FIG. 14, the same components as those illustrated in FIG. 13 are identified by the same reference numerals and the description thereof will be omitted herein. This modified example is characterized in that first and second flip-flops 125a and 125b are inserted between the selection signal input terminal 123 and the first inverter circuit 126A and between the selection signal input terminal 123 and the second inverter circuit 126B to form a shift register 125.

In this configuration, the number of external pins for the selection signal input terminal 123 can be reduced.

Accordingly, the area occupied by the interconnection lines for selection signals can be drastically cut down and no burden is constituted on the interconnection region of the circuit.

The shift register 125 does not have to be dedicated to testing. For example, a flip-flop within a logic circuit implementing functional logic may be used as the shift register 125 only during testing.

In the first and second modified examples of the first embodiment, testing-dedicated functional blocks, i.e., functional blocks including no circuits with predetermined functions such as logic circuits, memory circuits, etc., are described. In designing a semiconductor integrated circuit using the functional blocks according to the present invention, any of the test data output circuits 12 described in respective modified examples of the third embodiment may be selected depending on the desired circuit size.

Fourth Modified Example of Third Embodiment

Hereinafter, a fourth modified example of the third embodiment of the present invention will be described with reference to the drawings.

FIG. 15 illustrates test data output patterns of the test data output circuit in the functional block according to a fourth modified example of the third embodiment. A method for generating an output pattern will be described with reference to FIGS. 15(a) through 15(c).

First, as shown in FIG. 15(a), each test data pattern is divided into two groups. In this embodiment, each test data pattern is composed of 8 bits. For example, a data pattern, in which the four lower-order bits (hereinafter, referred to as "LSB bits") are all zero and the four higher-order bits (hereinafter, referred to as "MSB bits") are all one, may be output at a time t1. At the next time t2, a data pattern, in which the four LSB bits are all one and the four MSB bits are all zero, may be output. Thereafter, this inverting output operation will be repeatedly performed a predetermined number of times.

Next, as shown in FIG. 15(b), the four LSB bits are divided into two groups and the four MSB bits are also divided into two groups at a time t5, thereby forming four groups and outputting a data pattern in which the value of one of the groups divided is different from that of the adjacent one. Thereafter, at a time t6, the pattern that was output at the time t5 is entirely inverted and then output. From the time t6 on, the pattern will be inverted and output at every test time.

Subsequently, as shown in FIG. 15(c), each of the four groups is further divided into two at a time t9, thereby forming eight groups and outputting a data pattern in which the value of one of the groups divided is different from that of the adjacent one. Thereafter, at a time t10, the pattern that was output at the time t9 is entirely inverted and then output. From the time t9 on, the pattern will be inverted and output at every test time.

For example, if a test data output circuit with a similar configuration to that of the test data output circuit 12 shown in FIG. 10 is used, such an output pattern for a test data pattern is easily implementable by changing the polarities of the selection signals for the respective groups obtained when a bit pattern is divided into groups.

According to this modified example, signals with a complementary relationship are supplied through each signal line located on the border line between adjacent groups (indicated by a broken line) as shown in FIGS. 15(a) through 15(c). Thus, if this grouping is performed until the bit pattern is no longer divisible, complementary signals can be propagated through all possible combinations of adjacent signal lines, of which the number is represented as $2^n$ (where n is a positive integer). Accordingly, an output pattern with a complementary relationship can be generated automatically without taking any particular combination of adjacent signal lines into account. Also, the output patterns also show a complementary relationship on the time axis. Thus, a fault resulting from the interference by an adjacent signal line, such as crosstalk, can be detected easily and more accurately.

It should be noted that grouping should preferably be, but does not have to be, equal division.

Fourth Embodiment

Hereinafter, a fourth embodiment of the present invention will be described with reference to the drawings.

FIG. 16 illustrates test data patterns used for testing a semiconductor integrated circuit according to the fourth embodiment of the present invention. As shown in FIG. 16, each test data pattern is composed of bits with an identical value and the bits in the previous test data pattern are inverted and then output at every test time. Specifically, all the bits are output as zero at a time t1, all the bits are output as one at a time t2 and then all the bits are output as zero at a time t3.

Such an inverted signal can be easily generated using the test data output circuit 12 shown in FIG. 10, for example. That is to say, in the test data output circuit 12, all of the first through fourth selector circuits 122A through 122D may select either the non-inverted or inverted input signal from the original data generating section 121.

In this case, the semiconductor integrated circuit 1 shown in FIG. 1 may be tested as in the first embodiment. First, the first, second and third functional blocks 10, 20 and 30 of the semiconductor integrated circuit 1 are made to enter test data transmission, testing standby and test data reception states, respectively.

Next, the test data patterns shown in FIG. 16 are output at such an interval as not exceeding the maximum signal propagation time allowed for the inter-block signal line 2.

In this case, if such a fault as increasing the propagation delay of the signal on the inter-block signal line 2 has happened, then the decision result output circuit 36 erroneously takes in the test data, which was output at the previous time, as the received data. As a result, abnormal test data is received. For example, if the test data pattern that was output at the time t1 has delayed too much when the test data pattern that was output at the time t2 should be received, at least one of the bits in the test data pattern received by the decision result output circuit 36 becomes zero. Similarly, if the test data pattern that was output at the time t2 has delayed too much when the test data pattern that was output at the time t3 should be received, at least one of the bits in the test data pattern received by the decision result output circuit 36 becomes one.

Next, the test result signals output by the test result output circuit 6, which are associated with the times t1, t2 and t3, respectively, are monitored from the outside of the semiconductor integrated circuit 1. If one of the test result signals does not have its normal value, then the semiconductor integrated circuit 1 is evaluated defective, or no-go.

As can be seen, unlike the scan method used for a conventional delay test, a fault due to a signal propagation delay on the inter-block signal line 2 can be detected quickly according to this embodiment without consuming a large number of clock cycles.

Fifth Embodiment

Hereinafter, a fifth embodiment of the present invention will be described with reference to the drawings.

Figure 17A:
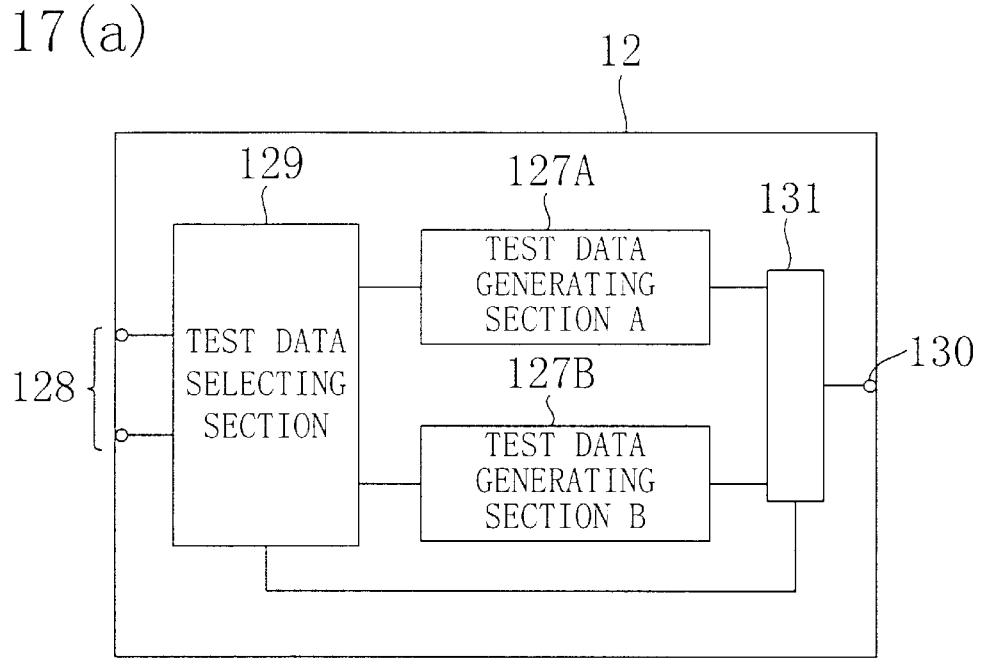
FIG. 17(a) is a block circuit diagram illustrating a test data output circuit of an IC functional block according to the fifth embodiment of the present invention.
Figure 17B:
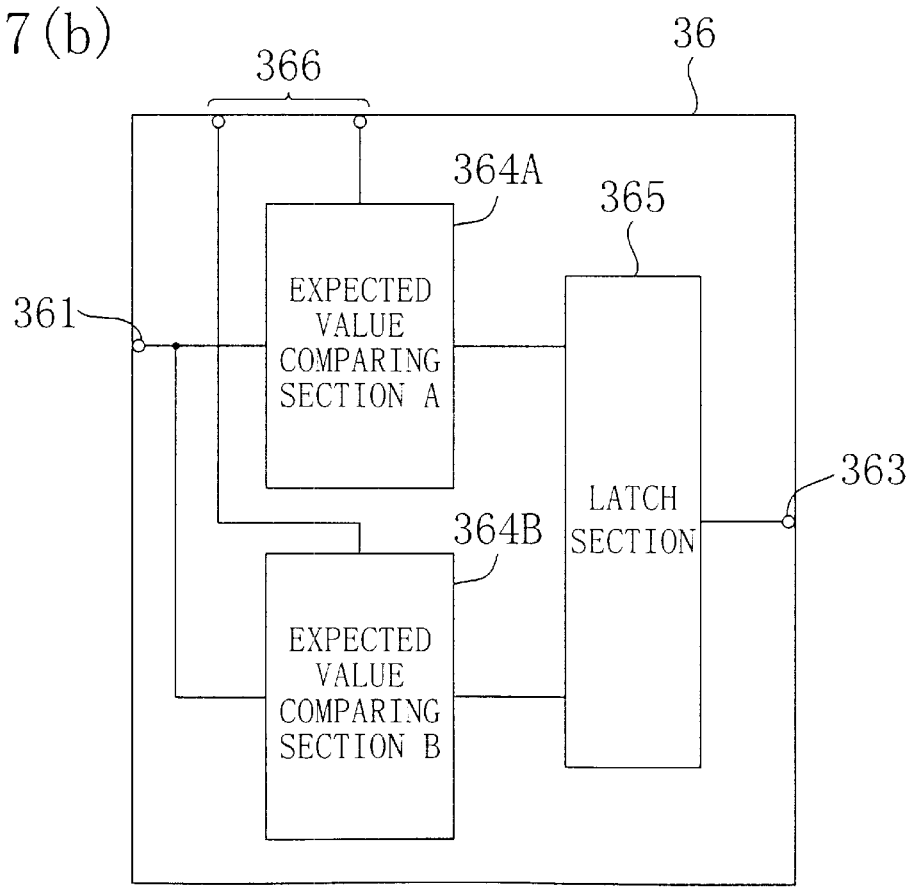
FIG. 17(b) is a block circuit diagram illustrating a decision result output circuit of the IC functional block according to the fifth embodiment of the present invention.

FIG. 17(a) illustrates a circuit configuration of a test data output circuit for a functional block according to the fifth embodiment of the present invention. FIG. 17(b) illustrates a circuit configuration of a decision result output circuit for the functional block according to the fifth embodiment of the present invention. As shown in FIG. 17(a), the test data output circuit 12 according to this embodiment includes first and second test data generating sections 127A and 127B. For example, the first and second test data generating sections 127A and 127B may generate the output patterns shown in FIGS. 5 and 16, respectively.

The test data output circuit 12 in the test data transmission state receives a selection control signal, which has been input to a selection control signal input terminal 128, and outputs a selection signal for selecting either the first or second test data generating section 127A or 127B responsive to the selection control signal. A selector circuit 131 for outputting the selected test data pattern to a test data output terminal 130 is provided on the outputting end of the first and second test data generating sections 127A and 127B.

As shown in FIG. 17(b), the decision result output circuit 12 according to this embodiment includes first and second expected value comparing sections 364A and 364B. The first and second expected value comparing sections 364A and 364B may decide whether the output patterns shown in FIGS. 5 and 16, respectively, are correct or erroneous.

The decision result output circuit 36 in the test data reception state receives the test data pattern at a test data input terminal 361, and activates either the first or second expected value comparing section 364A or 364B responsive to a selection control signal that has been input to a selection control signal input terminal 366. Thereafter, a decision result is output from the expected value comparing section activated to a latch section 365 and then output as a decision result signal to the outside of the functional block, as described above.

As can be seen, the test data output circuit 12 has mutually different test data generating sections according to this embodiment. Thus, an optimum test data pattern can be selected depending on the situation of testing. As a result, testing can be performed more efficiently.

It should be noted that part of the first test data generating section 127A may be shared in common with the second test data generating section 127B. The same statement is also applicable to the first and second expected value comparing sections 364A and 364B.

Sixth Embodiment

Hereinafter, a sixth embodiment of the present invention will be described with reference to the drawings.

Figure 18:
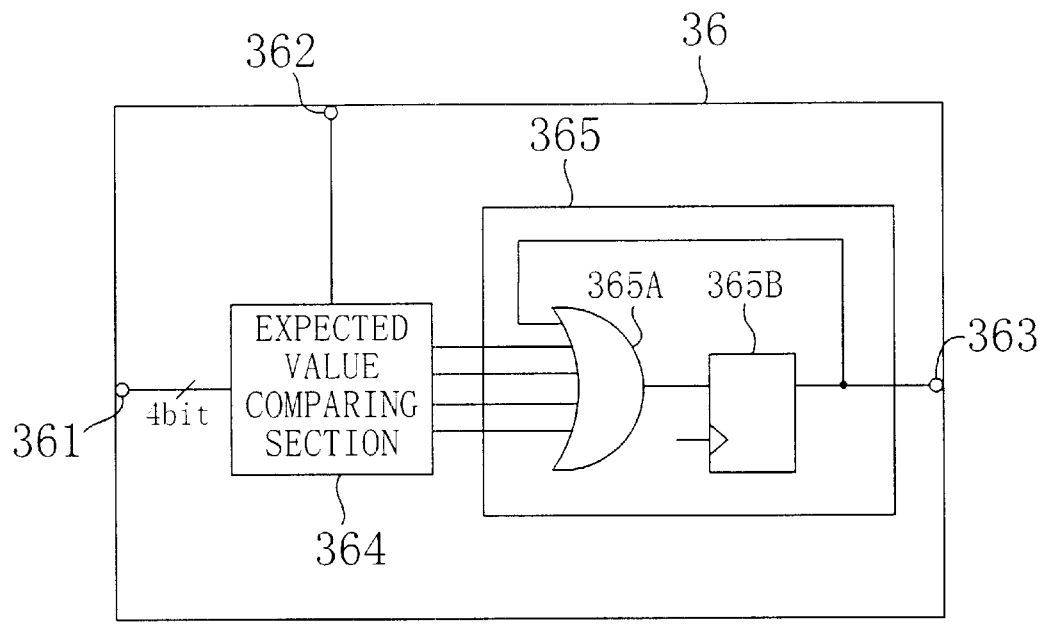
FIG. 18 is a circuit diagram illustrating a decision result output circuit of an IC functional block according to a sixth embodiment of the present invention.

FIG. 18 illustrates a circuit configuration of a decision result output circuit for a functional block according to a sixth embodiment of the present invention. In FIG. 18, the same components as those illustrated in FIG. 2 are identified by the same reference numerals and the description thereof will be omitted herein. As shown in FIG. 18, the decision result output circuit 36 according to this embodiment includes means for holding HIGH data, which is output when the decision result supplied from the expected value comparing section 364 is "erroneous". Specifically, a feedback loop is formed by an OR circuit 365A and a flip-flop circuit 365B in the latch section 365, thereby holding the HIGH data representing a fault therein.

For example, suppose the bit pattern shown in FIG. 5 is used as the test data pattern. In such a case, comparison and decision are performed at respective test times and if an erroneous signal has been reached, then the signal is further latched and held by the latch section 365. On the other hand, after the decision result output circuit 36 of the third functional block 30 has received the entire test data pattern, the test result output circuit 6 of the semiconductor integrated circuit 1 receives a decision result signal and outputs it as a test result to the outside of the semiconductor integrated circuit 1.

As can be seen, the decision signal of the test data pattern received is held by the decision result output circuit 36 according to this embodiment. Thus, batch processing can be performed, i.e., all the decision signals can be checked at a time when testing ends. Also, until the testing is over, the external terminal 7 provided on the outputting end of the test result output circuit 6 shown in FIG. 1 can be used for various purposes other than testing. Accordingly, the number of external pins can be reduced and increase in circuit size can be suppressed.

Seventh Embodiment

Hereinafter, a seventh embodiment of the present invention will be described with reference to the drawings.

Figure 19:
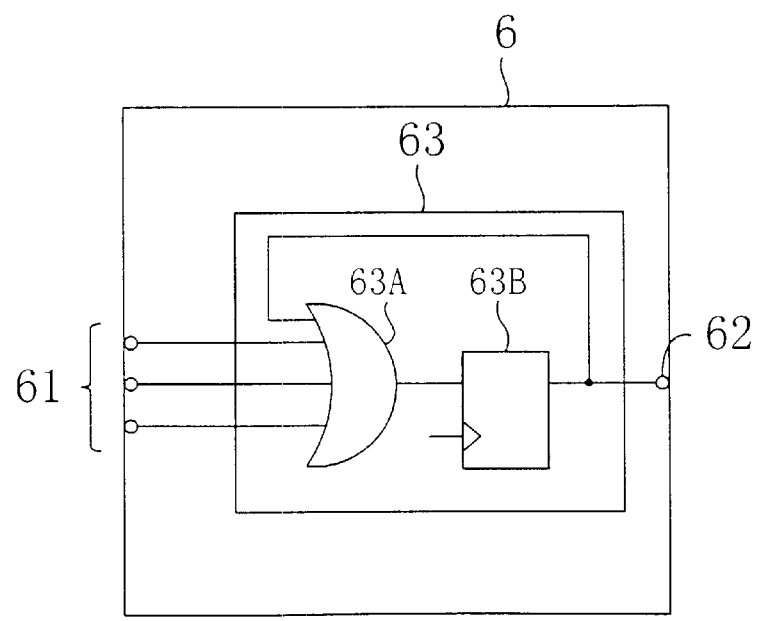
FIG. 19 is a circuit diagram illustrating a test result output circuit of an IC functional block according to a seventh embodiment of the present invention.

FIG. 19 illustrates a circuit configuration of a test result output circuit for a functional block according to the seventh embodiment of the present invention. In FIG. 19, the same components as those illustrated in FIG. 3 are identified by the same reference numerals and the description thereof will be omitted herein. As shown in FIG. 19, the test result output circuit 6 according to this embodiment includes means for holding HIGH data representing that the decision result signal supplied from the decision result output circuit is erroneous. Specifically, a feedback loop is formed by an OR circuit 63A and a flip-flop circuit 63B in the latch section 63, thereby holding the HIGH data representing a fault therein.

As can be seen, the decision signal of the test data pattern received is held by the test result output circuit 6 according to this embodiment. Thus, batch processing can be performed, i.e., all the decision signals can be checked at a time when testing ends.

Also, the means for holding the fault signal is implemented as the single test result output circuit 6, which is commonly used in the entire semiconductor integrated circuit 1. Accordingly, when the respective inter-block signal lines 2 are tested, the required circuit size can be further reduced. In addition, by the time the testing is over, the external terminal 7 provided on the outputting end of the test result output circuit 6 shown in FIG. 1 may be used for various purposes other than testing, and the number of external pins can be reduced. As a result, increase in circuit size can be suppressed, for example.

Eighth Embodiment

Hereinafter, an eighth embodiment of the present invention will be described with reference to the drawings.

Figure 20:
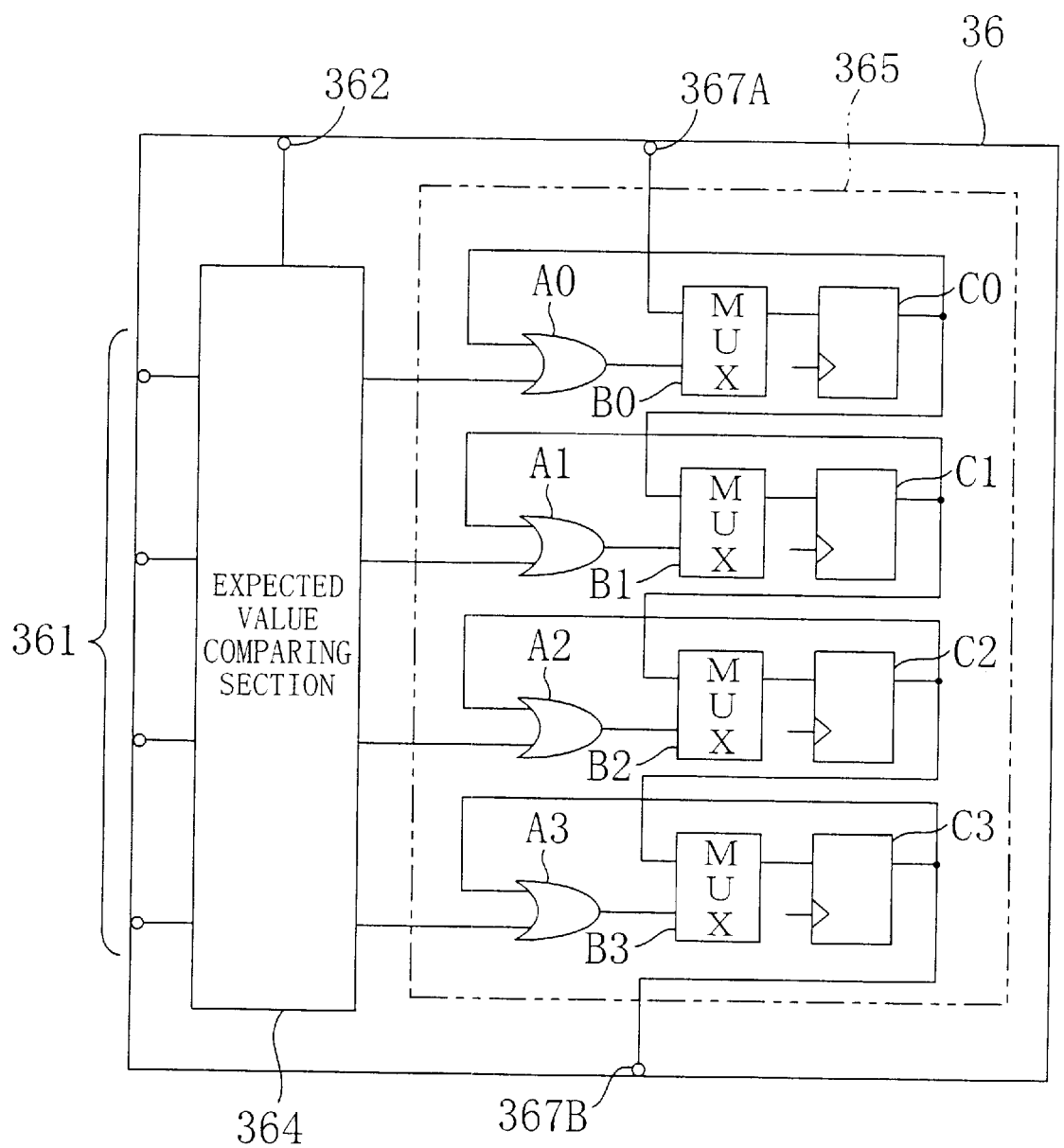
FIG. 20 is a circuit diagram illustrating a decision result output circuit of an IC functional block according to an eighth embodiment of the present invention.

FIG. 20 illustrates a circuit configuration of a decision result output circuit for a functional block according to an eighth embodiment of the present invention. Each decision result output circuit described above gets an abnormality in a test data pattern composed of multiple bits stuck at a one-bit decision result and then outputs it. In contrast, the decision result output circuit according to this embodiment does not output the decision result signals in parallel, but is adapted to estimate the presence/absence of an abnormality in each bit of the test data pattern. In FIG. 20, the same components as those illustrated in FIG. 2 are identified by the same reference numerals and the description thereof will be omitted herein. As shown in FIG. 20, the latch section 365 includes first through fourth OR circuits A0 through A3, first through fourth selector circuits B0 through B3 and first through fourth flip-flop circuits C0 through C3 in accordance with the bit width of the test data pattern.

The first OR circuit A0 receives first test data (Bit 0) at one input terminal thereof from the expected value comparing section and also receives the output signal of the first flip-flop circuit C0 at the other input terminal thereof.

The first selector circuit B0 receives the output signal of the first OR circuit A0 at one input terminal thereof and also receives a scan signal supplied through a scan-in terminal 367A at the other input terminal thereof.

The first flip-flop circuit C0 receives the output signal of the first selector circuit B0. The output signal of the circuit C0 forms a feedback loop with the first OR circuit A0 and is also input to the second selector circuit B1 to form a shift register. In this configuration, if there is any abnormality in the data of Bit 0 supplied from the expected value comparing section, then the HIGH data is held by the feedback loop.

The second test data supplied from the expected value comparing section, i.e., Bit 1, is also processed similarly by a circuit consisting of the second OR circuit A1, second selector circuit B1 and second flip-flop circuit C1. The third and fourth test data, i.e., Bits 2 and 3, are also processed in the same way as the test data of Bit 0.

In the test data reception state, the decision result output circuit 36 according to this embodiment receives a predetermined number of test data patterns shown in FIG. 5, for example. Thereafter, responsive to a test control signal (not shown), the circuit 36 selectively enables one of the selector circuits B0 through B3 to form a shift register out of the flip-flops C0 through C3. Then, the circuit 36 outputs the data, which is held in the shift register, as a decision result signal through a scan-out terminal 367B, which is connected to the output terminal of the fourth flip-flop circuit C3, to the test result output circuit 6 of the semiconductor integrated circuit 1 shown in FIG. 1. In this case, the test result output circuit 6 according to this embodiment may output the decision result signal as it is.

As can be seen, according to this embodiment, the decision result signal is held by the decision result output circuit 36 for every bit of the test data pattern. Thus, the detailed information about the test data pattern can be checked without providing a larger number of interconnection lines or external pins. Also, batch processing can be performed, i.e., all the decision result signals can be checked at a time when testing ends.

Also, when the decision result signals are checked at the end of testing for a semiconductor integrated circuit including a plurality of decision result output circuits 36 according to this embodiment, a new shift register may be formed by coupling the output of each of the shift registers to the input of an associated shift register. In such a case, the decision result signals can be read out successively from a plurality of decision result output circuits 36, thus improving the testing efficiency.

Also, a feedback loop consisting of an OR circuit and a flip-flop circuit is used as means for holding the fault data in the latch section 365. Alternatively, a multi-input signature register (MISR) using a linear feedback shift register may also be employed.

When an MISR is used, a decision result signal is held after having been compressed. Thus, although the detailed bit-by-bit information is lost, the expected value comparing section 362 does not have to compare a test data pattern to its expected value at every test time. Accordingly, the expected value comparing section 362 may have its configuration simplified. Furthermore, a test data pattern, which has been received without passing through the expected value comparing section 362, may be used as it is.

Ninth Embodiment

Hereinafter, a ninth embodiment of the present invention will be described with reference to the drawings.

Figure 21:
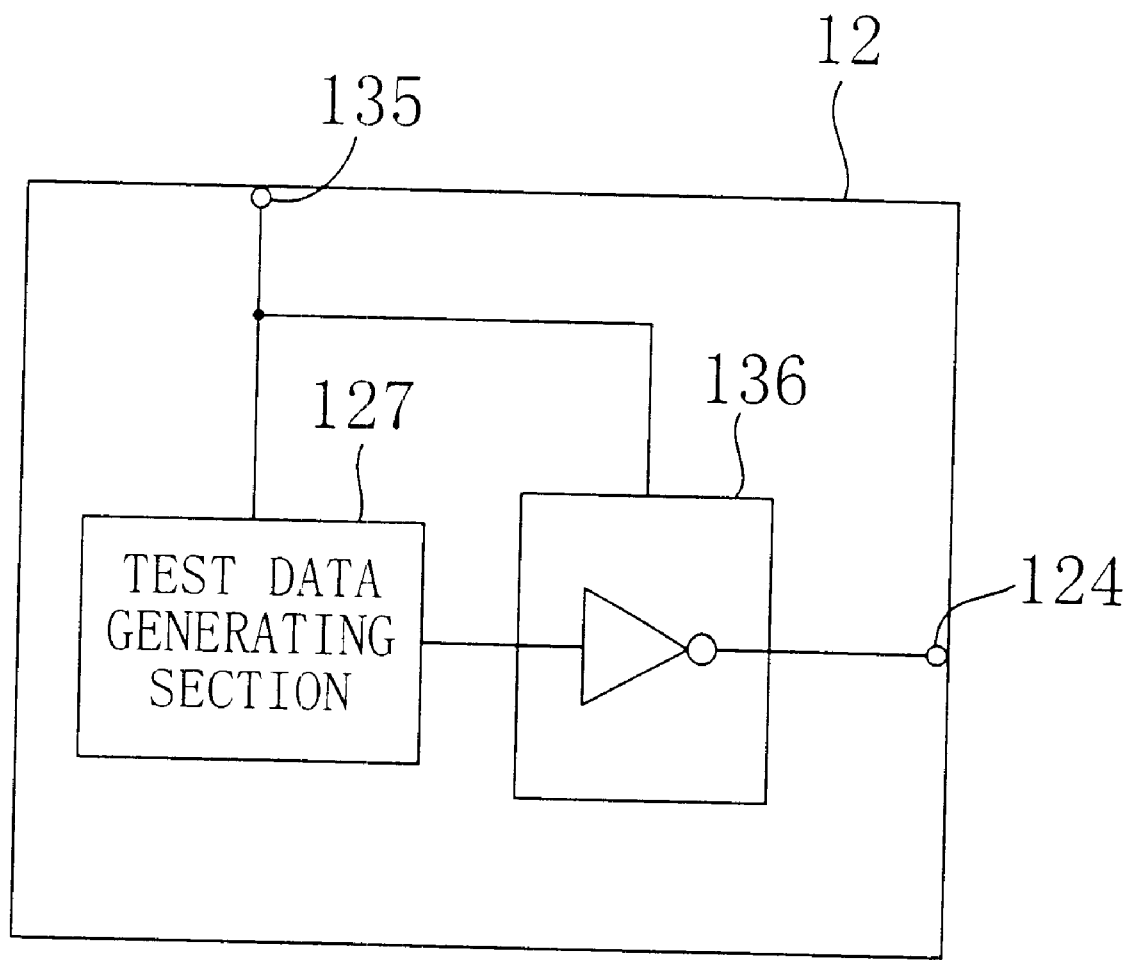
FIG. 21 is a circuit diagram illustrating a test data output circuit of an IC functional block according to a ninth embodiment of the present invention.

FIG. 21 illustrates a circuit configuration of a test data output circuit for a functional block according to a ninth embodiment of the present invention. As shown in FIG. 21, the test data output circuit 12 according to this embodiment includes a test data generating section 127, which receives a test control signal through a control signal input terminal 135 and generates and outputs a predetermined test data pattern. The circuit 12 further includes an inverted state generator circuit 136 as an inverted data generating section, which is connected between the test data generating section 127 and a test data output terminal 124 and inverts and outputs the test data pattern generated responsive to the test control signal.

Hereinafter, the operation of the test data output circuit 12 with such a configuration and a method for testing a semiconductor integrated circuit including a functional block having the test data output circuit 12 will be described.

First, suppose the test data output circuit 12 shown in FIG. 21 is included in one of a plurality of functional blocks. If the functional block is in the test data transmission state, then a predetermined test data pattern is generated by the test data generating section 127 and then output as it is as in the first embodiment. Accordingly, a decision result output circuit included in another functional block in the test data reception state compares the test data pattern received to its expected value, decides whether it is correct or erroneous and then outputs the decision result to the test result output circuit.

And if still another functional block in the test data reception state or testing standby state includes a test data output circuit 12, the inverted state generator circuit 136 of the test data output circuit 12 is activated. As a result, the test data pattern output from the test data generating section 127 is inverted and then output.

A specific example will be described with reference to FIG. 1.

First, suppose the test data output circuits 12 and 22 included in the first and second functional blocks 10 and 20 shown in FIG. 1 both include the inverted state generator circuit 136 and the first, second and third functional blocks 10, 20 and 30 are in the test data transmission state, testing standby state and test data reception state, respectively.

If the test data output circuit 12 included in the first functional block 10 outputs the test data pattern for the time t1 shown in FIG. 5, then the test data output circuit 22 included in the second functional block 20 outputs a test data pattern obtained by inverting all the bits of the test data pattern for the time t1. In this case, since the tristate buffer 25 of the second functional block 20 is in the high-impedance state and the output is blocked as described above, the inverted test data pattern is not output unless there is any fault. However, if the tristate buffer 25 is not in the high-impedance state due to some fault, then the signals with opposite logical values from the first and second functional blocks 10 and 20 come across each other on the inter-block signal line 2. Accordingly, an abnormal signal is more likely to reach the third functional block 30. In this manner, the accuracy of testing can be improved.

Tenth Embodiment

Hereinafter, a tenth embodiment of the present invention will be described with reference to the drawings.

Figure 22:
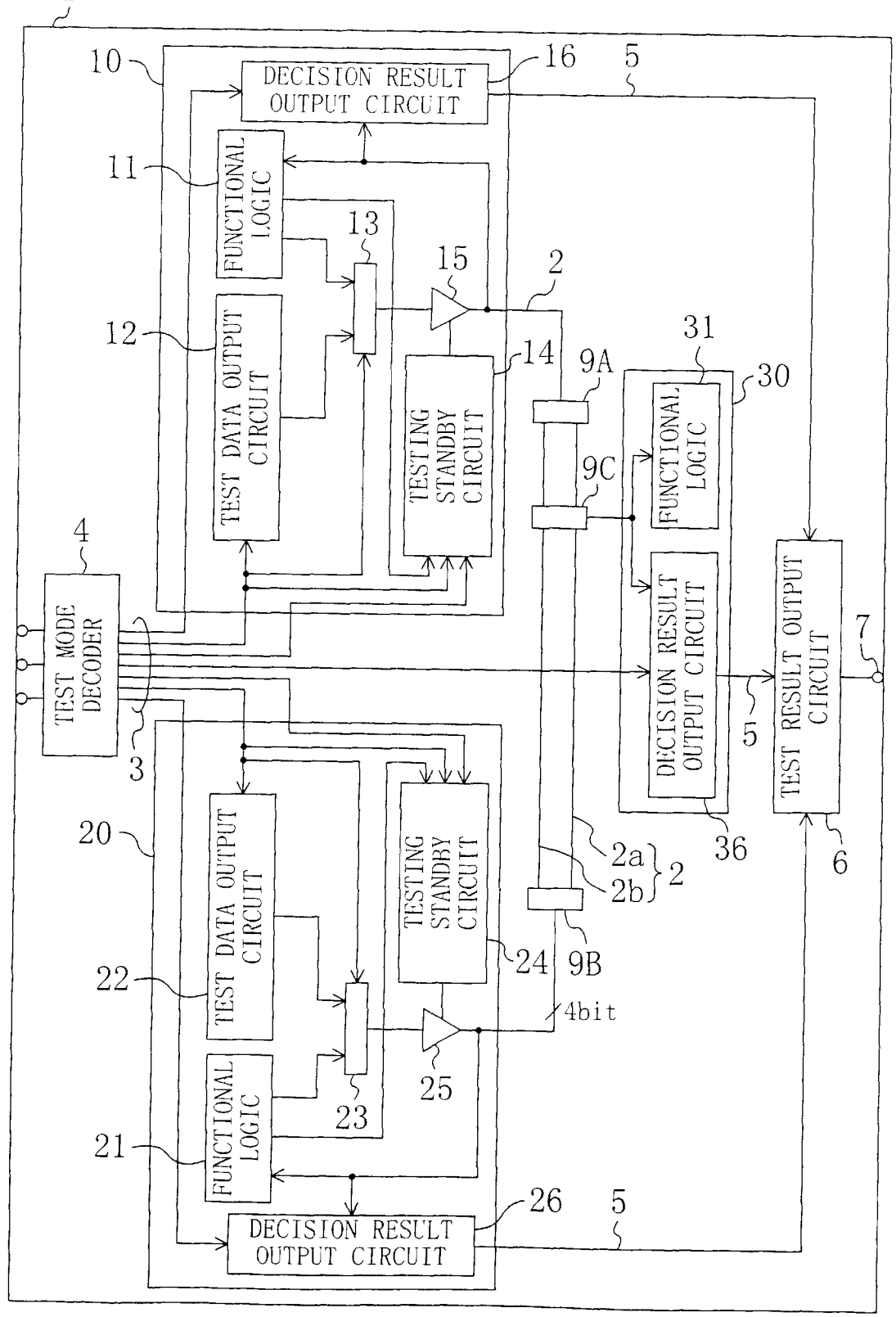
FIG. 22 is a circuit diagram illustrating a semiconductor integrated circuit according to a tenth embodiment of the present invention.
Figure 25:
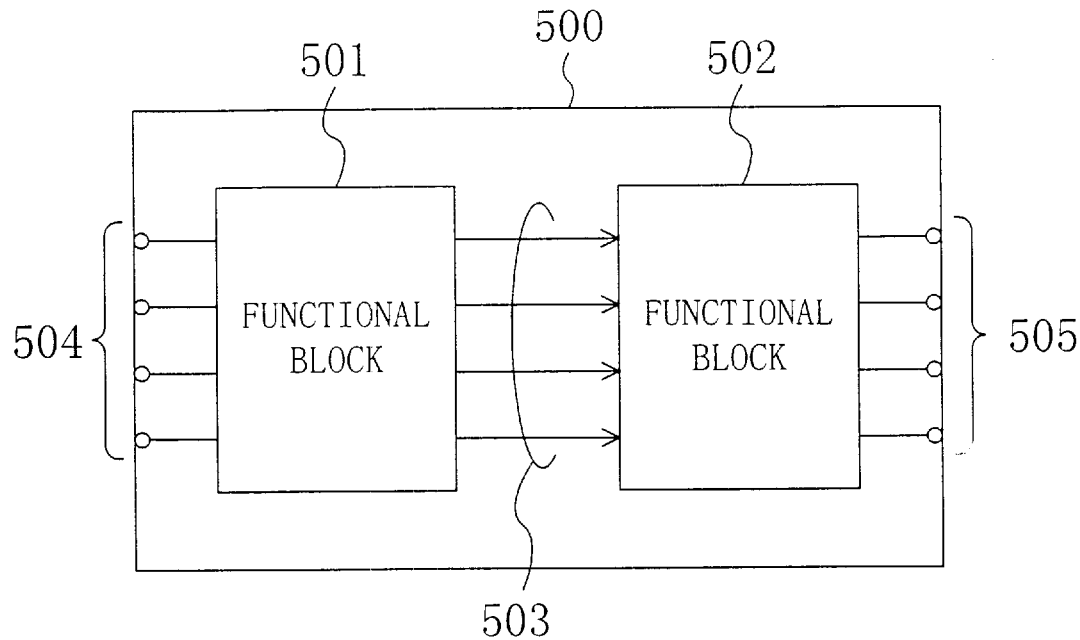
FIG. 25 is a schematic block diagram of a conventional semiconductor integrated circuit illustrating an exemplary method for testing the functional blocks thereof.
Figure 26:
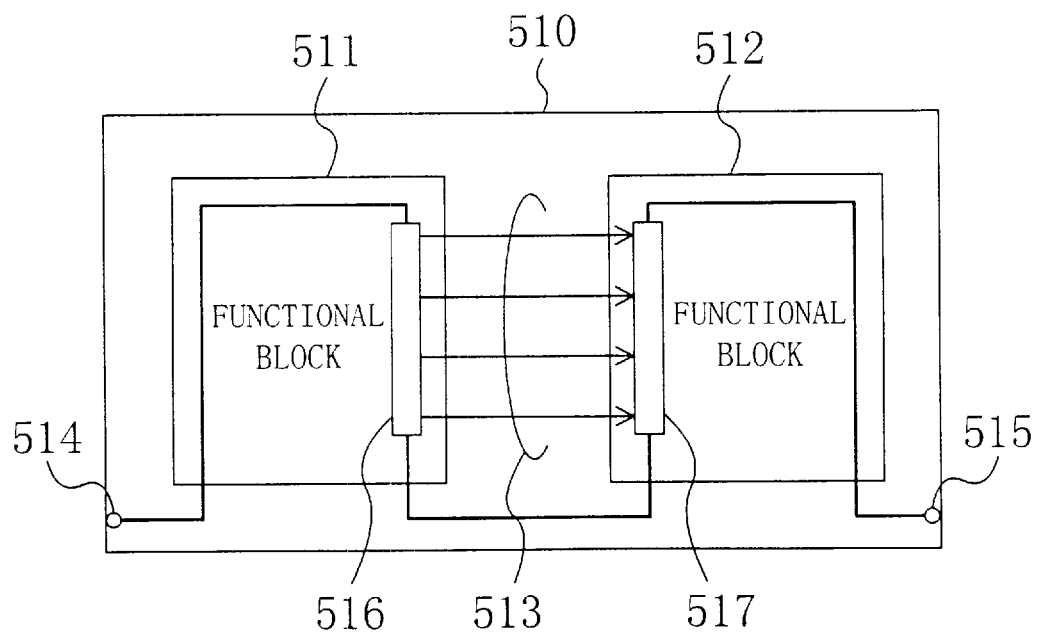
FIG. 26 is a schematic block diagram of a conventional semiconductor integrated circuit illustrating an exemplary method for testing the functional blocks thereof using shift registers.

FIG. 22 illustrates a circuit configuration of a semiconductor integrated circuit according to the tenth embodiment of the present invention. In FIG. 22, the same components as those illustrated in FIG. 1 are identified by the same reference numerals and the description thereof will be omitted herein. In this embodiment, first and second signal paths 2a and 2b, such as a crossbar switch, are provided in part of the inter-block signal line 2 as shown in FIG. 22. Each of the test data output circuits 12 and 22 of the first and second functional blocks 10 and 20 includes a plurality of test data generating sections as in the fifth embodiment. And the third functional block 30 includes a plurality of expected value comparing sections.

In the inter-block signal line 2, a first path switch 9A for selecting either the first or second signal path 2a or 2b is provided as a switch circuit for the output terminal of the first functional block 10. A second path switch 9B for selecting either the first or second signal path 2a or 2b is provided for the output terminal of the second functional block 20. And a third path switch 9C for selecting either signal path 2a or 2b is also provided for the input terminal of the third functional block 30.

Hereinafter, a method for testing the semiconductor integrated circuit with such a configuration will be described with reference to the drawings.

First, suppose the test data output circuit 12 of the first functional block 10 shown in FIG. 1 includes two test data generating sections. One of the test data generating sections generates the test data pattern shown in FIG. 23, the other test data generating section generates the test data pattern shown in FIG. 24 and one of these patterns is output. As shown in FIGS. 23 and 24, each test data pattern includes not only a bit pattern for testing, but also one-bit path control signal for switching the signal paths. For example, a path control signal "1" may correspond to the first signal path 2a and a path control signal "0" may correspond to the second signal path 2b.

In the illustrated example, a test data generating section, which can output the test data pattern shown in FIG. 23 through the test control signal line 3, is supposed to be selected. Then, responsive to the path control signal "1" in the test data pattern, the first and third path switches 9A and 9C are activated to select the first signal path 2a. As a result, the test data pattern passes through the first and third path switches 9A and 9C and the first signal path 2a and then reaches the decision result output circuit 36 of the third functional block 30 in the test data reception state.

Then, the decision result output circuit 36 compares at least the data portion thereof (i.e., Bits 0 through 3) to the expected values thereof and decides whether it is correct or erroneous.

Similarly, if the test data pattern shown in FIG. 24 is output, the first and third path switches 9A and 9C are also activated responsive to the path control signal "0" in the test data pattern to select the second signal path 2b.

As can be seen, even if a plurality of signal paths are provided for the inter-block signal line 2, the inter-block signal line 2 can be tested efficiently according to this embodiment by using selectable test data patterns associated with these signal paths.

What is claimed is:

1. A semiconductor integrated circuit comprising:
   a first functional block including a test data output circuit for outputting test data responsive to a first control signal indicating a test data transmission state;
   a second functional block for the integrated circuit, including a decision result output circuit for receiving the test data responsive to a second control signal indicating a test data reception state, deciding whether the test data received is correct or erroneous, and outputting a result of the decision;
   a test control output section for outputting the first and second control signals to the first and second functional blocks for integrated circuit, respectively; and
   a test result output circuit for receiving a decision result signal from the decision result output circuit and outputting the received decision result signal as a test result signal.

2. The semiconductor integrated circuit of claim 1, further comprising:
   an output signal line including a plurality of signal paths interconnecting the first and second functional blocks for the integrated circuit together; and
   a switching circuit, which is connected to the output signal line, for switching the signal paths by selecting one of the signal paths, and
   wherein the test data output circuit outputs a path control signal for controlling the switching circuit.

3. The semiconductor integrated circuit of claim 1, wherein the test result output circuit outputs the test result on receiving the decision result.

4. The semiconductor integrated circuit of claim 1, wherein the test result output circuit includes holding means for holding the decision result thereon.

5. The semiconductor integrated circuit of claim 1, further comprising a third functional block for the integrated circuit, including a testing standby circuit for blocking the output of an output signal responsive to a third control signal indicating a testing standby state, and
   wherein the test control output section outputs the third control signal to the third functional block for the integrated circuit.

6. The semiconductor integrated circuit of claim 5, further comprising:
   an output signal line including a plurality of signal paths interconnecting one of the first, second and third functional blocks for the integrated circuit to the other ones; and
   a switching circuit, which is connected to the output signal line, for switching the signal paths by selecting one of the signal paths, and
   wherein the test data output circuit outputs a path control signal for controlling the switching circuit.

7. The semiconductor integrated circuit of claim 1, wherein a plurality of the second functional blocks for the integrated circuit are provided, and that each said second functional block for integrated circuit includes a shift register for holding the decision result thereon, and that the shift registers are connected together to form a single composite shift register.

8. A method for testing a semiconductor integrated circuit, the semiconductor integrated circuit comprising: a first functional block including a test data output circuit for outputting test data responsive to a first control signal indicating a test data transmission state; a second functional block for the integrated circuit, including a decision result output circuit for receiving the test data responsive to a second control signal indicating a test data reception state, deciding whether the test data received is correct or erroneous, and outputting a result of the decision; a third functional block for the integrated circuit, including a testing standby circuit for blocking the output of an output signal responsive to a third control signal indicating a testing standby state; a test control output section for outputting the first, second and third control signals to the first, second and third functional blocks for the integrated circuit, respectively; and a test result output circuit for receiving a decision result signal from the decision result output circuit and outputting the received decision result signal as a test result signal, the method comprising:

a test data transmitting step for making the test control output section output the first control signal to make the test data output circuit of the first functional block for the integrated circuit output the test data;

a test data receiving step for making the test control output section output the second control signal to make the decision result output circuit of the second functional block for the integrated circuit, which is connected to the first functional block for the integrated circuit, receive the test data;

a testing standby step for making the test control output section output the third control signal to make the testing standby circuit of the third functional block for the integrated circuit, which is connected to the first functional block for the integrated circuit, block the output; and a test result reading step for reading the test result from the test result output circuit.

9. The method for testing a semiconductor integrated circuit of claim 8, wherein the test data output circuit includes a plurality of output signal lines enabling parallel output, and the test data transmitting step includes:

an initial signal line dividing step for dividing the output signal lines into two groups and outputting the test data through the output signal lines such that the respective groups divided have mutually different values, which change from one value into the other;

a signal line dividing step for dividing each said group into two groups and outputting the test data through the output signal lines such that the respective groups divided have mutually different values, which change from one value into the other; and a testing step for repeatedly performing the signal line dividing step util the output signal line belonging to each said group is no longer divisible.

10. A method for designing a semiconductor integrated circuit using a plurality of functional blocks for the integrated circuit, each said functional block for the integrated circuit performing a predetermined function of a logic or memory circuit, the method comprising:

a functional block designing step for introducing, into each of the functional blocks for the integrated circuit, at least one of: a test data output circuit for outputting test data responsive to a control signal indicating a test data transmission state; a decision result output circuit for receiving the test data responsive to a control signal indicating a test data reception state, deciding whether the test data received is correct or erroneous, and outputting a result of the decision; and a testing standby circuit for blocking the output of an output signal responsive to a control signal indicating a testing standby state;

a functional block library forming step for forming a library of functional blocks by registering the functional blocks for the integrated circuit, which have been made in the functional block designing step, at the library; and a functional block selecting step for selecting such a functional block for the integrated circuit as enabling a desired semiconductor integrated circuit from the functional blocks for the integrated circuit that are included in the library of functional blocks.

* * * * *

UNITED STATES PATENT AND TRADEMARK OFFICE
CERTIFICATE OF CORRECTION

PATENT NO. : 6,708,301 B1
DATED : March 16, 2004
INVENTOR(S) : Ohta, M., et al.

It is certified that error appears in the above-identified patent and that said Letters Patent is hereby corrected as shown below:

<u>Title page,</u>
Item [56], References Cited, FOREIGN PATENT DOCUMENTS, please add:

-- FOREIGN PATENT DOCUMENTS
62-62275    JP   3/1987
1-237472    JP   9/1989
6-186302    JP   7/1994
5-52910     JP   3/1993
5-158724    JP   6/1993 --

Signed and Sealed this

Fourteenth Day of December, 2004

JON W. DUDAS
*Director of the United States Patent and Trademark Office*